(12) United States Patent
Song et al.

(10) Patent No.: US 12,322,338 B2
(45) Date of Patent: *Jun. 3, 2025

(54) DISPLAY PANEL AND DISPLAY DEVICE

(71) Applicant: SAMSUNG ELECTRONICS CO., LTD., Suwon-si (KR)

(72) Inventors: Uijong Song, Suwon-si (KR); Sunkwon Kim, Suwon-si (KR); Seongyoung Ryu, Suwon-si (KR); Heejin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/421,288

(22) Filed: Jan. 24, 2024

(65) Prior Publication Data

US 2024/0321213 A1    Sep. 26, 2024

(30) Foreign Application Priority Data

Mar. 24, 2023 (KR) .................. 10-2023-0039188
May 19, 2023 (KR) .................. 10-2023-0064985
May 19, 2023 (KR) .................. 10-2023-0064986

(51) Int. Cl.
*H10K 59/131*    (2023.01)
*G09G 3/3233*    (2016.01)
(Continued)

(52) U.S. Cl.
CPC ......... *G09G 3/3233* (2013.01); *G09G 3/3266* (2013.01); *G09G 3/3275* (2013.01);
(Continued)

(58) Field of Classification Search
CPC .. G09G 3/3233; G09G 3/3266; G09G 3/3275; G09G 2300/0814;
(Continued)

(56) References Cited

U.S. PATENT DOCUMENTS 6,372,608 B1   4/2002   Shimoda et al.
6,645,830 B2   11/2003  Shimoda et al.
(Continued)

FOREIGN PATENT DOCUMENTS

CN    113808532 A    12/2021

*Primary Examiner* — Temesghen Ghebretinsae
*Assistant Examiner* — K. Kiyabu
(74) *Attorney, Agent, or Firm* — Sughrue Mion, PLLC

(57) ABSTRACT

A display device includes a plurality of pixels, a scan driver, a data driver, and a read-out circuit configured to read out electrical characteristics of the plurality of pixels. A first pixel of the plurality of pixels includes a first transistor connected to a first node and having a gate connected to a second node, a second transistor, a third transistor, a fourth transistor, a fifth transistor, a sixth transistor including a first terminal connected to a seventh conductive line, a second terminal connected to the second node, and having a gate connected to a fourth conductive line, a seventh transistor including a first terminal connected to the seventh conductive line, a second terminal connected to a third node, and a gate connected to a fifth conductive line, a capacitor, and an organic light emitting diode.

20 Claims, 23 Drawing Sheets

(51) Int. Cl.
    *G09G 3/3266*     (2016.01)
    *G09G 3/3275*     (2016.01)
(52) U.S. Cl.
    CPC ... *H10K 59/131* (2023.02); *G09G 2300/0814*
        (2013.01); *G09G 2300/0819* (2013.01); *G09G*
        *2300/0842* (2013.01); *G09G 2300/0861*
        (2013.01); *G09G 2310/0278* (2013.01); *G09G*
        *2310/08* (2013.01); *G09G 2320/0626*
        (2013.01); *G09G 2330/021* (2013.01)
(58) Field of Classification Search
    CPC ... G09G 2300/0819; G09G 2300/0842; G09G
                  2300/0861; G09G 2310/0278; G09G
                      2310/08; G09G 2320/0626; G09G
                              2330/021; H10K 59/131
    See application file for complete search history.

(56)            References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,558,768 B2 | 10/2013 | Tanikame | |
| 8,735,931 B2 | 5/2014 | Han et al. | |
| 8,766,295 B2 | 7/2014 | Kim | |
| 10,381,426 B2 | 8/2019 | Ka et al. | |
| 11,410,605 B2 | 8/2022 | Hong et al. | |
| 11,462,163 B2 | 10/2022 | Lin et al. | |
| 11,508,309 B2 | 11/2022 | Lin et al. | |
| 2013/0009936 A1* | 1/2013 | Tanikame | G09G 3/3233 345/211 |
| 2015/0123557 A1* | 5/2015 | Lee | G09G 3/3233 315/228 |
| 2016/0217728 A1* | 7/2016 | In | G09G 3/2096 |
| 2021/0027711 A1* | 1/2021 | Qin | G06V 40/1318 |
| 2022/0037430 A1* | 2/2022 | Lee | H10K 59/131 |
| 2023/0008371 A1* | 1/2023 | Lee | G09G 3/3258 |
| 2023/0013661 A1 | 1/2023 | Beard et al. | |
| 2023/0043940 A1* | 2/2023 | Bae | H10K 59/131 |

\* cited by examiner

DISPLAY PANEL AND DISPLAY DEVICE

CROSS-REFERENCE TO RELATED APPLICATIONS

This application claims priority to Korean Patent Application No. 10-2023-0039188, filed on Mar. 24, 2023, Korean Patent Application No. 10-2023-0064985, filed on May 19, 2023, and Korean Patent Application No. 10-2023-0064986, filed on May 19, 2023, in the Korean Intellectual Property Office, the disclosures of which are incorporated by reference herein in their entireties.

BACKGROUND

The present disclosure relates to a semiconductor device, and more particularly, to a display panel and a display device.

A display device includes a display panel for displaying images and a display drive circuit for driving the display panel. The display drive circuit may drive the display panel by transmitting an image signal corresponding to image data to a data line of the display panel. Recently, organic light emitting diode (OLED) display panels have been increasingly used.

A display device may include a plurality of pixels. The plurality of pixels may be arranged in rows and columns, and each of the plurality of pixels may include an OLED. The rows of the plurality of pixels may be connected to a scan driver, and the columns of the plurality of pixels may be connected to a data driver. The scan driver may control timing of selecting each of the rows of the plurality of pixels. The data driver may adjust the brightness of pixels in the selected row. To reduce the size and increase the resolution of display devices, pixel size has been reduced. As the pixel size has been reduced, the range of a current flowing through each of the pixels may be limited. As the range of the current flowing through each of the pixels is limited, it may be more difficult to control the brightness of pixels.

SUMMARY

One or more example embodiments provide a display panel that may easily adjust the brightness of pixels and a display device including the display panel.

According to an aspect of an example embodiment, a display device includes: a plurality of pixels arranged in rows and columns; a scan driver connected to the rows of the plurality of pixels through a plurality of first conductive lines, a plurality of second conductive lines, a plurality of third conductive lines, a plurality of fourth conductive lines, and a plurality of fifth conductive lines; a data driver connected to the columns of the plurality of pixels through a plurality of sixth conductive lines; and a read-out circuit connected to the columns of the plurality of pixels through a plurality of seventh conductive lines and configured to obtain a plurality of read-out signals indicating electrical characteristics of the plurality of pixels through the plurality of seventh conductive lines. A first pixel of the plurality of pixels is connected to a first conductive line among the plurality of first conductive lines, a second conductive line among the plurality of second conductive lines, a third conductive line among the plurality of third conductive lines, a fourth conductive line among the plurality of fourth conductive lines, a fifth conductive line among the plurality of fifth conductive lines, a sixth conductive line among the plurality of sixth conductive lines and a seventh conductive line among the plurality of seventh conductive lines. The first pixel includes: a first transistor including a first terminal connected to a first node, a second terminal connected to a third node, and a gate connected to a second node; a second transistor including a first terminal connected to the sixth conductive line, a second terminal connected to the first node, and a gate connected to the first conductive line; a third transistor including a first terminal connected to the second node, a second terminal connected to the third node, and a gate connected to the first conductive line; a fourth transistor including a first terminal connected to a power supply node to which a power supply voltage is supplied, a second terminal connected to the first node, and a gate connected to the second conductive line; a fifth transistor including a first terminal connected to the third node, a second terminal, and a gate connected to the third conductive line; a sixth transistor including a first terminal connected to the seventh conductive line, a second terminal connected to the second node, and a gate connected to the fourth conductive line; a seventh transistor including a first terminal connected to the seventh conductive line, a second terminal connected to the third node, and a gate connected to the fifth conductive line; a capacitor connected between the first node and the second node; and an organic light emitting diode connected between the second terminal of the fifth transistor and a ground node to which a ground voltage is supplied.

According to another aspect of an example embodiment, a display panel includes: a plurality of pixels. A first pixel of the plurality of pixels includes: a scan line extending in a first direction; a first light emission control line extending in the first direction; a second light emission control line extending in the first direction; an initialization line extending in the first direction; a read-out control line extending in the first direction; a data line extending in a second direction crossing the first direction; a read-out line extending in the second direction; a first transistor connected between a first node and a third node, and configured to operate according to a voltage of a second node; a second transistor connected between the first node and the data line, and configured to operate according to a scan signal received through the scan line; a third transistor connected between the second node and the third node, and configured to operate according to the scan signal; a fourth transistor connected between a first drive power node and the first node, and configured to operate according to a first light emission control signal received through the first light emission control line; a fifth transistor connected between the third node and an organic light emitting diode, and configured to operate according to a second light emission control signal received through the second light emission control line; a sixth transistor connected between the read-out line and the second node, and configured to operate according to an initialization signal received through the initialization line; a seventh transistor connected between the read-out line and the third node, and configured to operate according to a read-out control signal received through the read-out control line; a capacitor connected between the first node and the second node; and the organic light emitting diode connected between the fifth transistor and a second drive power node.

According to another aspect of an example embodiment, a display device includes: a display panel including a plurality of pixels; and a display drive circuit including a scan driver, a data driver, and a read-out circuit. A first pixel of the plurality of pixels includes: an organic light emitting diode; a first transistor connected between a first node and a third node, and configured to operate according to a voltage of a second node; a second transistor connected between the first node and a data line, and configured to operate according to a scan signal received through a scan line; a third transistor connected between the second node and the third node, and configured to operate according to the scan signal; a fourth transistor connected between a first drive power supply and the first node, and configured to operate according to a first light emission control signal received through a first light emission control line; a fifth transistor connected between the third node and the organic light emitting diode, and configured to operate according to a second light emission control signal received through a second light emission control line; a sixth transistor connected between a read-out line and the second node, and configured to operate according to an initialization signal received through an initialization line; a seventh transistor connected between the read-out line and the third node, and configured to operate according to a read-out control signal received through a read-out control line; and a capacitor connected between the first node and the second node. The organic light emitting diode is connected between the fifth transistor and a second drive power supply. The scan driver is connected to the plurality of pixels through the scan line, the first light emission control line, the second light emission control line, the initialization line, and the read-out control line. The data driver is connected to the plurality of pixels through the data line and is configured to supply a data voltage corresponding to luminance through the data line. The read-out circuit is connected to the plurality of pixels through the read-out line, and is configured to read out electrical characteristics of the plurality of pixels through the read-out line.

BRIEF DESCRIPTION OF DRAWINGS

The above and other objects and features will be more clearly understood from the following description of example embodiments, taken in conjunction with the accompanying drawings, in which.

DETAILED DESCRIPTION

Hereinafter, example embodiments are described with reference to the accompanying drawings. Each example embodiment provided in the following description is not excluded from being associated with one or more features of another example or another example embodiment also provided herein or not provided herein but consistent with the present disclosure. As used herein, the term "and/or" includes any and all combinations of one or more of the associated listed items. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
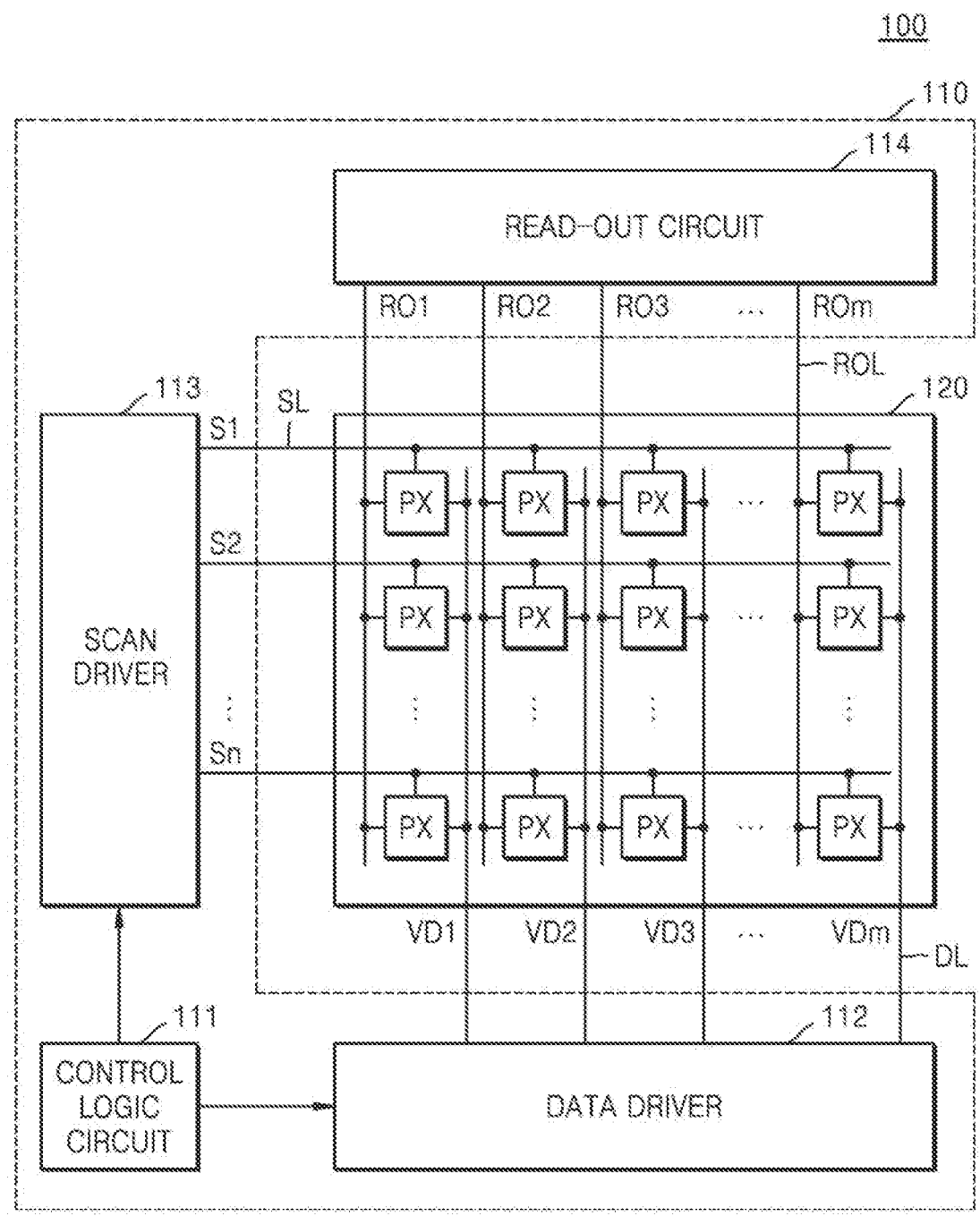
FIG. 1 is a block diagram illustrating a display device according to an example embodiment.

FIG. 1 is a block diagram illustrating a display device according to an example embodiment.

Referring to FIG. 1, a display device 100 may include a display drive circuit 110 (which may be referred to as a display drive integrated circuit) and a display panel 120.

In one example embodiment, the display device 100 may be mounted in an electronic device having an image display function. For example, the electronic device may include a smartphone, a tablet personal computer (PC), a portable multimedia player (PMP), a camera, a wearable device, a television, a digital video disk (DVD) player, a refrigerator, an air conditioner, an air purifier, a set-top box, a robot, a drone, various medical devices, a navigation device, an augmented reality (AR) device, a virtual reality (VR) device, a global positioning system receiver, an advanced drivers assistance system (ADAS), a vehicle device, furniture, various measurement devices, etc.

In one example embodiment, the display device 100 may include augmented reality glasses worn on the face of a user, a head mounted display (HMD) device worn on the head, a virtual reality headset (VRH), an augmented reality helmet, or so on.

The display device 100 may display image data received from a host. In one example embodiment, the display device 100 may be a device in which the display drive circuit 110 and the display panel 120 are implemented as a single module. For example, the display drive circuit 110 may be mounted on a board of the display panel 120, or the display drive circuit 110 may be electrically connected to the display panel 120 through a connection member, such as a flexible printed circuit board (FPCB).

The display panel 120 is a display unit on which an actual image is displayed, and may be one of display devices that receive an electrically transmitted image signal and display a two-dimensional image, such as an organic light emitting diode (OLED) display, a thin film transistor-liquid crystal display (TFT-LCD), a field emission display, and a plasma display panel (PDP). Hereinafter, it is assumed that the display panel 120 is an OLED display panel in which each pixel includes an OLED. However, example embodiments are not limited thereto, and the display panel 120 may be implemented as a flat panel display or a flexible display panel of another type.

The display panel 120 may be connected to a scan driver (i.e., a scan driver circuit) 113 through a plurality of first conductive lines to a plurality of fifth conductive lines. For example, the plurality of first conductive lines may include a plurality of scan lines SL. The plurality of second conductive lines may include a plurality of first light emission control lines. The plurality of third conductive lines may include a plurality of second light emission control lines. The plurality of fourth conductive lines may include a plurality of initialization lines. The plurality of fifth conductive lines may include a plurality of read-out control lines.

The display panel 120 may be connected to a data driver (i.e., a data driver circuit) 112 through a plurality of sixth conductive lines. The plurality of sixth conductive lines may include a plurality of data lines DL. The display panel 120 may be connected to a read-out circuit 114 through a plurality of seventh conductive lines. The plurality of seventh conductive lines may include a plurality of read-out lines ROL.

The display drive circuit 110 may receive image data IDT from a host. The display drive circuit 110 may convert the image data IDT into a plurality of analog signals for driving the display panel 120, for example, a plurality of data voltages. The display drive circuit 110 may supply the plurality of converted analog signals to the display panel 120. Accordingly, an image corresponding to the image data IDT may be displayed on the display panel 120.

The display drive circuit 110 may include a control logic circuit 111, the data driver 112 (which may be referred to as a source driver), the scan driver 113 (which may be referred to as a gate driver), and the read-out circuit 114. The display drive circuit 110 may further include other general-purpose components, such as an interface circuit, a memory, a voltage generator, and a clock generator.

In one example embodiment, the control logic circuit 111, the data driver 112, the scan driver 113, and the read-out circuit 114 may be integrated into a single semiconductor chip. Alternatively, the control logic circuit 111, the data driver 112, and the read-out circuit 114 may be formed in one semiconductor chip, and the scan driver 113 may be formed in the display panel 120.

The control logic circuit 111 may control all operations of the display drive circuit 110 and may control components of the display drive circuit 110, such as the data driver 112, the scan driver 113, and the read-out circuit 114, such that image data received from a host is displayed on the display panel 120.

In addition, the control logic circuit 111 may perform image processing for a brightness change, a size change, a format change, or other processing, of the received image data, or may generate new image data to be displayed on the display panel 120 based on the received image data. To this end, the control logic circuit 111 may include intellectual properties (IPs) for image processing. For example, an IP may include circuitry to perform specific functions, and may have a design that includes a trade secret.

The control logic circuit 111 may provide a data driver control signal to the data driver 112. The control logic circuit 111 may control the data driver 112 through the data driver control signal. The control logic circuit 111 may provide a scan driver control signal to the scan driver 113. The control logic circuit 111 may control the scan driver 113 through the scan driver control signal. Alternatively, the control logic circuit 111 may control operation timing of the scan driver 113 through a timing signal.

The data driver 112 may be connected to columns of pixels PX through the plurality of data lines DL. The data driver 112 may receive image data from the control logic circuit 111. The image data may include information of brightness (or luminance) of pixels PX in one row. The data driver 112 may convert the received image data into a plurality of image signals, for example, a plurality of data voltages VD1 to VDm. The data driver 112 may output the plurality of data voltages VD1 to VDm to the display panel 120 through the plurality of data lines DL.

The data driver 112 may receive image data in line data units, that is, in data units corresponding to a plurality of pixels included in one horizontal line of the display panel. The data driver 112 may convert the line data received from the control logic circuit 111 into the plurality of data voltages VD1 to VDm (m is an integer greater than or equal to 2). The data driver 112 may provide the plurality of data voltages VD1 to VDm corresponding to luminance to the display panel 120 through a plurality of data lines DL.

The scan driver 113 may be connected to a plurality of control lines. In one example embodiment, the scan driver 113 may be connected to rows of the pixels PX through the plurality of control lines. The plurality of control lines may include the plurality of scan lines SL, the plurality of first light emission control lines, the plurality of second light emission control lines, the plurality of initialization lines, and the plurality of read-out control lines.

The scan driver 113 may receive a scan driver control signal from the control logic circuit 111. The scan driver 113 may output a plurality of control signals to the display panel 120 through the plurality of control lines according to a scan driver control signal received from the control logic circuit 111. For example, the scan driver 113 may be connected to the plurality of scan lines SL of the display panel 120 and may sequentially drive (or select) the plurality of scan lines SL of the display panel 120.

The scan driver 113 may sequentially provide scan signals S1 to Sn (n is a positive integer greater than or equal to 2) having an active level (for example, a logic low level) to the plurality of scan lines SL under control by the control logic circuit 111. Accordingly, the plurality of scan lines SL may be sequentially selected, and the plurality of data voltages VD1 to VDm may be applied to the plurality of pixels PX connected to the selected scan lines SL.

In one example embodiment, the scan driver 113 may provide a plurality of control signals to the plurality of pixels PX. The plurality of control signals may include a scan signal, a first light emission control signal, a second light emission control signal, an initialization signal, and a read-out control signal. For example, the scan driver 113 may provide the scan signal to the pixel PX through the scan line. The scan driver 113 may provide the first light emission control signal to the pixel PX through the first light emission control line. The scan driver 113 may provide the second light emission control signal to the pixel PX through the second light emission control line. The scan driver 113 may provide the initialization signal to the pixel PX through the initialization line. The scan driver 113 may provide the read-out control signal to the pixel PX through the read-out control line.

The read-out circuit 114 may be connected to columns of the pixels PX through the plurality of read-out lines ROL. For example, the read-out circuit 114 may be connected to the plurality of read-out lines ROL. The read-out circuit 114 may receive a plurality of read-out signals RO1 to ROm from the display panel 120 through the plurality of read-out lines ROL. In one example embodiment, the read-out circuit 114 may include an amplifier, a sample/hold circuit, and an analog-to-digital converter.

In one example embodiment, the read-out circuit 114 may read out (or sense) electrical characteristics of the plurality of pixels PX. The read-out circuit 114 may receive the plurality of read-out signals RO1 to ROm through the plurality of read-out lines ROL. The plurality of read-out signals RO1 to Rom may indicate electrical characteristics of pixels connected to the plurality of read-out lines ROL. The read-out circuit 114 may receive the plurality of read-out signals RO1 to ROm corresponding to the selected pixels and perform analog-to-digital conversion of the read-out signals RO1 to ROm to generate read-out data. The read-out circuit 114 may provide the generated read-out data to the control logic circuit 111.

For example, the read-out circuit 114 may detect a drive current of each of the plurality of pixels PX. The read-out circuit 114 may detect a threshold voltage of each of the plurality of pixels PX. The read-out circuit 114 may detect a forward voltage of each of the plurality of pixels PX.

The read-out circuit 114 may measure the magnitude of the drive current of each of the plurality of pixels PX. The read-out circuit 114 may measure the magnitude of the threshold voltage of each of the plurality of pixels PX. The read-out circuit 114 may measure the magnitude of the forward voltage of each of the plurality of pixels PX.

The display panel 120 may include the plurality of pixels PXs arranged in rows and columns. The display panel 120 may include the plurality of data lines DL, the plurality of scan lines SL, and the plurality of pixels PX between the plurality of data lines DL and the plurality of scan lines SL. Each of the plurality of pixels PX may be connected to a corresponding scan line SL and a corresponding data line DL.

Rows of the plurality of pixels PX may be connected to a plurality of control lines. Each of the plurality of pixels PX may be connected to one of the plurality of scan lines SL, a first light emission control line, a second light emission control line, an initialization line, and a read-out control line. The plurality of pixels PX may receive a plurality of control signals (for example, a first control signal to a fifth control signal) from the scan driver 113 through the plurality of control lines. For example, the first control signal may include a scan signal, the second control signal may include the first light emission control signal, the third control signal may include a second light emission control signal, the fourth control signal may include an initialization signal, and the fifth control signal may include a read-out control signal.

Each of the plurality of pixels PX may receive the scan signal through one of the plurality of scan lines SL, receive the first light emission control signal through the first light emission control line, receive the second light emission control signal through the second light emission control line, receive the initialization signal through the initialization line, and receive the read-out control signal through the read-out control line.

In one example embodiment, the display panel 120 may be connected to the plurality of read-out lines ROL. The display panel 120 may provide the plurality of read-out signals RO1 to ROm to the read-out circuit 114 through the plurality of read-out lines ROL.

Each of the pixels PX may adjust brightness according to a corresponding control signal. For example, each of the pixels PX may be selected according to a corresponding scan signal among a plurality of scan signals S1 to Sn. Each of the selected pixels PX may emit light based on a corresponding data voltage among a plurality of data voltages VD1 to VDm. Each of the pixels PX may include a light emitting element, such as an organic light emitting diode, and transistors controlling the light emitting element.

Each of the plurality of pixels PX may output light of a preset color, and two or more pixels PX (for example, a red pixel, a blue pixel, and a green pixel), which are adjacent to each other on the same line or adjacent lines and output light of different colors, may constitute one unit pixel. In this case, each of the two or more pixels PX constituting one unit pixel may be referred to as a sub-pixel. The display panel 120 may have an RGB structure in which a red pixel, a blue pixel, and a green pixel constitute one unit pixel. However, example embodiments are not limited thereto, and the display panel 120 may have an RGBW structure in which the unit pixel further includes a white pixel for improving luminance. Alternatively, the unit pixel of the display panel 120 may also be composed of a combination of pixels of other colors including red, green, and blue.

The display panel 120 may be an OLED display panel in which each of the plurality of pixels PX includes an organic light emitting diode. However, the display panel 120 is not limited thereto and may be implemented by a flat panel display or a flexible display panel of another type.

Figure 2:
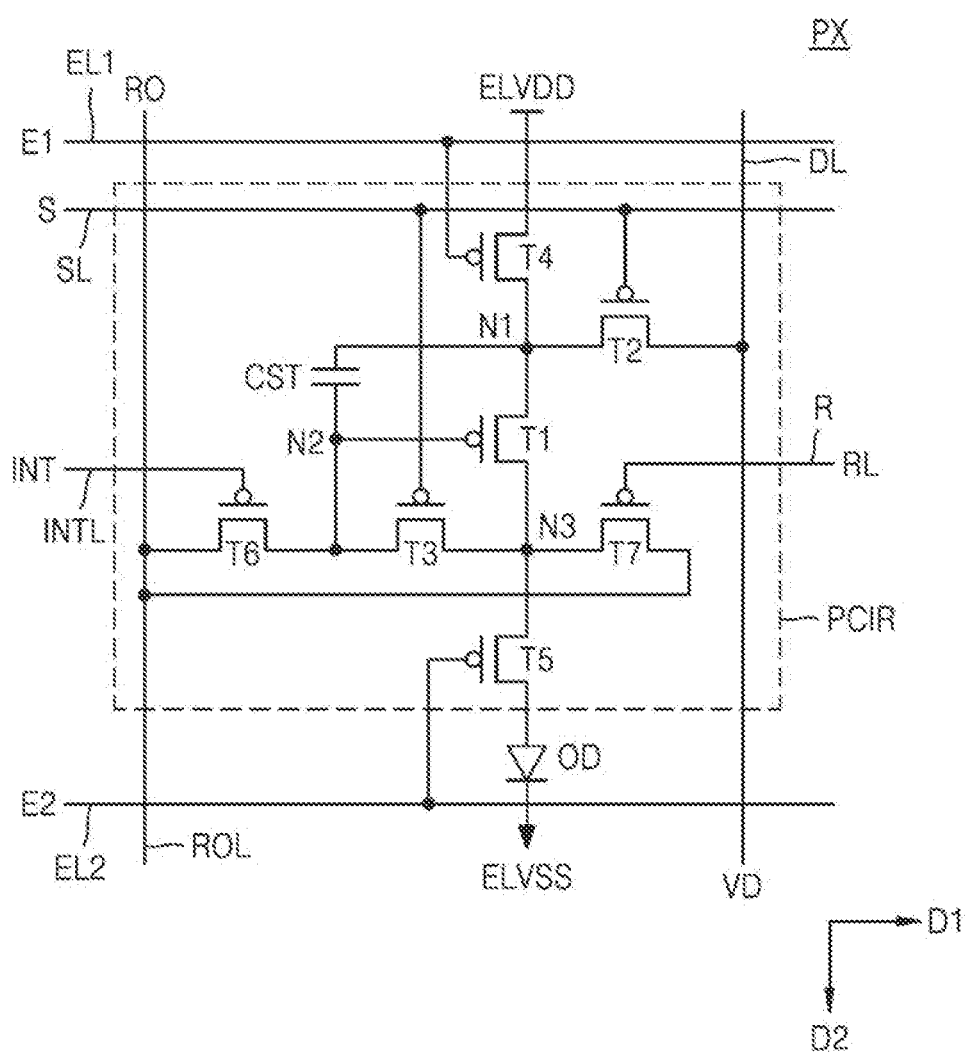
FIG. 2 is a circuit diagram illustrating an example of a pixel according to an example embodiment.

FIG. 2 is a circuit diagram illustrating a pixel according to an example embodiment. A pixel PX of FIG. 2 may be applied to the display device of FIG. 1.

Referring to FIGS. 1 and 2, the pixel PX may include an OLED OD and a pixel circuit PCIR. The pixel PX may include a scan line SL extending in a first direction D1, a first light emission control line EL1 extending in the first direction D1, a second light emission control line EL2 extending in the first direction D1, an initialization line INTL extending in the first direction D1, a read-out control line RL extending in the first direction D1, a data line DL extending in a second direction D2 perpendicular to the first direction D1, a read-out line ROL extending in the second direction D2, a first transistor T1, a second transistor T2, a third transistor T3, a fourth transistor T4, a fifth transistor T5, a sixth transistor T6, a seventh transistor T7, a storage capacitor CST, and the OLED OD. For example, the first direction D1 may be an X-axis direction, and the second direction D2 may be a Y-axis direction.

An anode electrode of the OLED OD may be connected to the pixel circuit PCIR, and a cathode electrode may be connected to a second drive power supply ELVSS (or a ground node to which a ground voltage is supplied). The OLED OD may emit light with luminance corresponding to a current supplied from the pixel circuit PCIR. The brightness of the OLED OD may be controlled by a voltage (that is, a data voltage VD) of the data line DL.

The pixel circuit PCIR may control the current flowing from a first drive power supply ELVDD to the second drive power supply ELVSS via the OLED OD according to the data voltage VD. The pixel circuit PCIR may include the first transistor T1 to the seventh transistor T7 and a storage capacitor CST. At least one of the first transistor T1 to the seventh transistor T7 may be implemented by an oxide semiconductor thin film transistor including an active layer formed of an oxide semiconductor, a low temperature polycrystalline silicon (LTPS) thin film transistor including an active layer formed of polysilicon, or a metal oxide semiconductor field effect transistor (MOSFET). In one example embodiment, at least one of the first transistor T1 to the seventh transistor T7 may be formed as a P-type transistor. However, at least one of the first transistor T1 to the seventh transistor T7 is not limited thereto and may be formed as an N-type transistor.

The first transistor T1 (or a drive transistor) may be connected between a first node N1 and a third node N3, and operate according to a voltage of a second node N2. A first electrode (or a first terminal) of the first transistor T1 may be connected to the first node N1, and a second electrode (or a second terminal) of the first transistor T1 may be connected to the third node N3. A gate electrode (or a gate) of the first transistor T1 may be connected to the second node N2. The first transistor T1 may control the current flowing from the first drive power supply ELVDD to the second drive power supply ELVSS via the OLED OD according to the voltage of the second node N2.

The second transistor T2 (or a select transistor) may be connected between the data line DL and the first node N1, and operate according to a scan signal S. A first electrode (or a first terminal) of the second transistor T2 may be connected to the data line DL, and a second electrode (or a second terminal) of the second transistor T2 may be connected to the first node N1. A gate electrode (or a gate) of the second transistor T2 may be connected to the scan line SL. The second transistor T2 may be turned on in response to the scan signal S at an active level provided through the scan line SL. The second transistor T2 may be turned on to electrically connect the first node N1 to the data line DL.

The third transistor T3 may be connected between the second node N2 and the third node N3, and operate according to the scan signal S. A first electrode (or a first terminal) of the third transistor T3 may be connected to the second node N2, and a second electrode (or a second terminal) of the third transistor T3 may be connected to the third node N3. A gate electrode (or a gate) of the third transistor T3 may be connected to the scan line SL. The third transistor T3 may be turned on in response to the scan signal S at an active level provided through the scan line SL. The third transistor T3 may be turned on to electrically connect the second node N2 to the third node N3. That is, the third transistor T3 may cause the first transistor T1 to operate as a diode.

The fourth transistor T4 may be connected between the first drive power supply ELVDD and the first node N1, and operate according to a first light emission control signal E1. A first electrode (or a first terminal) of the fourth transistor T4 may be connected to the first drive power supply ELVDD (or a power supply node to which a power supply voltage is supplied), and a second electrode (or a second terminal) of the fourth transistor T4 may be connected to the first node N1. A gate electrode (or a gate) of the fourth transistor T4 may be connected to a first light emission control line EL1. The fourth transistor T4 may be turned on in response to the first light emission control signal E1 at an active level provided through the first light emission control line EL1. The fourth transistor T4 may be turned on to provide (or supply) a voltage of the first drive power supply ELVDD to the first node N1.

The fifth transistor T5 may be connected between the third node N3 and the OLED OD, and operate according to a second light emission control signal E2. A first electrode (or a first terminal) of the fifth transistor T5 may be connected to the third node N3, and a second electrode (or a second terminal) of the fifth transistor T5 may be connected to the anode electrode of the OLED OD. A gate electrode (or a gate) of the fifth transistor T5 may be connected to a second light emission control line EL2. The fifth transistor T5 may be turned on in response to a second light emission control signal E2 at an active level provided through a second light emission control line EL2. The fifth transistor T5 may be turned on to electrically connect the third node N3 to the anode electrode of the OLED OD.

The sixth transistor T6 may be connected between the read-out line ROL and the second node N2, and operate according to an initialization signal INT. A first electrode (or a first terminal) of the sixth transistor T6 may be connected to the read-out line ROL, and a second electrode (or a second terminal) of the sixth transistor T6 may be connected to the second node N2. A gate electrode (or a gate) of the sixth transistor T6 may be connected to an initialization line INTL. The sixth transistor T6 may be turned on in response to the initialization signal INT at an active level provided through the initialization line INTL. The sixth transistor T6 may be turned on to provide a voltage from an initialization power supply VINT to the second node N2.

The seventh transistor T7 may be connected between the read-out line ROL and the third node N3, and operate according to a read-out control signal R. A first electrode (or a first terminal) of the seventh transistor T7 may be connected to the read-out line ROL, and a second electrode (or a second terminal) of the seventh transistor T7 may be connected to the third node N3. A gate electrode (or a gate) of the seventh transistor T7 may be connected to the read-out control line RL. The seventh transistor T7 may be turned on in response to the read-out control signal R at an active level provided through the read-out control line RL. The seventh transistor T7 may be turned on to electrically connect the third node N3 to the read-out line ROL. The storage capacitor CST may be connected between the first node N1 and the second node N2.

In one example embodiment, the pixel PX may perform a reset operation in a reset period. In the reset period, a voltage of the initialization power supply VINT may be applied to the second node N2 through the read-out line ROL. In a program period after the reset period, the pixel PX may perform a program operation. In the program period, the data voltage VD may be applied to the first node N1 through the data line DL. In a hold period after the program period, the pixel PX may perform a hold operation. In the hold period, the second transistor T2 to the seventh transistor may all be turned off. In a light emission period after the hold period, the pixel PX may perform a light emission operation. In the light emission period, the fourth transistor T4 and the fifth transistor T5 are turned on, and a drive current ID may be supplied to the OLED OD, and accordingly, the OLED OD may emit light with luminance corresponding to the drive current ID.

In one example embodiment, a voltage of the first drive power supply ELVDD may be higher than a voltage of the second drive power supply ELVSS. A voltage of the initialization power supply VINT may be less than a voltage obtained by subtracting a threshold voltage VTH of the first transistor T1 from the voltage of the first drive power supply ELVDD. That is, the voltage of the initialization power supply VINT may be represented by Equation 1.

$$VINT < ELVDD - VTH \qquad \text{Equation 1}$$

In one example embodiment, the pixel PX may include a first parasitic capacitor between the gate of the second transistor T2 and the second electrode (that is, the first node N1) of the second transistor T2. The pixel PX may include a second parasitic capacitor between the gate of the third transistor T3 and the first electrode (that is, the second node N2) of the third transistor T3. A range of the data voltage VD may increase according to the first and second parasitic capacitors.

The pixel PX according to an example embodiment may extend the range of the data voltage VD, which is reduced for a low area and a high resolution, by using the first parasitic capacitor, the second parasitic capacitor, and the storage capacitor CST. Accordingly, the display device 100 may easily adjust the brightness of the pixel PX.

In the pixel PX according to an example embodiment, the fourth transistor T4 and the fifth transistor T5 may independently operate. The scan driver 113 may independently control the fourth transistor T4 and the fifth transistor T5. The gate of the fourth transistor T4 may be connected to the first light emission control line EL1, and the gate of the fifth transistor T5 may be connected to the second light emission control line EL2. The fourth transistor T4 may operate according to the first light emission control signal E1, and the fifth transistor T5 may operate according to the second light emission control signal E2 different from the first light emission control signal E1. The scan driver 113 may independently control the first light emission control signal E1 and the second light emission control signal E2. Accordingly, the display device 100 according to an example embodiment may perform pulse width modulation (PWM) by adjusting the light emission time. A more detailed description of PWM will be made with reference to FIGS. 11A to 11C.

In the pixel PX according to an example embodiment, the seventh transistor T7 may provide a read-out signal RO to the read-out circuit 114 (in FIG. 1). The pixel PX may output the read-out signal RO to the read-out line ROL according to a read-out control signal R at an active level. That is, the pixel PX may perform a read-out operation in a read-out period.

The read-out operation may be an operation for testing electrical characteristics of a pixel. The display device 100 may perform the read-out operation in a test process of a manufacturing process. Alternatively (or additionally), the read-out operation may be an operation for measuring and compensating for the degree of pixel deterioration over time while a user uses the display device 100.

In one example embodiment, the read-out circuit 114 may detect a drive current, a threshold voltage, and a forward voltage. The read-out period may include first, second, and third read-out periods RO1, RO2, and RO3. The first read-out period RO1 may be a period for measuring the drive current ID, the second read-out period RO2 may be a period for measuring the threshold voltage VTH, and the third read-out period RO3 may be a period for measuring the forward voltage VF. More detailed descriptions of the read-out operation and the read-out period are given below.

As described above, the display device 100 according to an example embodiment may expand a range of data voltage and may easily adjust brightness of pixels. The display device 100 may perform dimming control using a pulse amplitude modulation (PAM) method or a pulse width modulation (PWM) method, and may improve brightness (or grayscale). The display device 100 may measure a drive current, a threshold voltage, and a forward voltage of a wafer or a package through a secured design for test (DFT) path and may implement the DFT.

Figure 3:
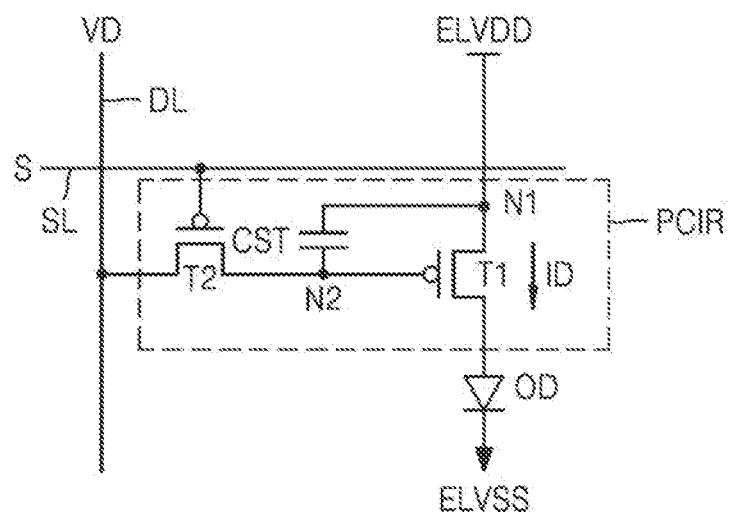
FIG. 3 is a circuit diagram of a pixel according to an example embodiment.

FIG. 3 is a circuit diagram illustrating a pixel according to an example embodiment.

Referring to FIG. 3, a pixel PXa may include an OLED OD and a pixel circuit PCIR. An anode of the OLED OD may be connected to the pixel circuit PCIR, and a cathode of the OLED OD may be connected to the second drive power supply ELVSS. The OLED OD may emit light with luminance corresponding to the current supplied from the pixel circuit PCIR.

The pixel circuit PCIR may control the current flowing from the first drive power supply ELVDD to the second drive power supply ELVSS via the OLED OD according to the data voltage VD. The pixel circuit PCIR may include a first transistor T1, a second transistor T2, and a storage capacitor CST. At least one of the first transistor T1 and the second transistor T2 may be implemented by an oxide semiconductor thin film transistor including an active layer formed of an oxide semiconductor, an LTPS thin film transistor including an active layer formed of polysilicon, or a metal oxide semiconductor field effect transistor (MOSFET).

A first electrode of the first transistor T1 may be connected to the first drive power supply ELVDD, and a second electrode of the first transistor T1 may be connected to the anode of the OLED OD. A gate of the first transistor T1 may be connected to a second node N2. The first transistor T1 may control the current flowing from the first drive power supply ELVDD to the second drive power supply ELVSS via the OLED OD according to a voltage of the second node N2.

A first electrode of the second transistor T2 may be connected to a data line DL, and a second electrode of the second transistor T2 may be connected to the second node N2. A gate of the second transistor T2 may be connected to a scan line SL. The storage capacitor CST may be connected between the first node N1 and the second node N2.

A scan signal, that is, a scan signal S at an active level, may be applied through the scan line SL. The second transistor T2 may be turned on in response to the scan signal S at an active level. The second transistor T2 may be turned on to provide the data voltage VD provided through the data line DL to the second node N2. The first transistor T1 may provide a drive current ID to the OLED OD according to the data voltage VD.

Figure 4:
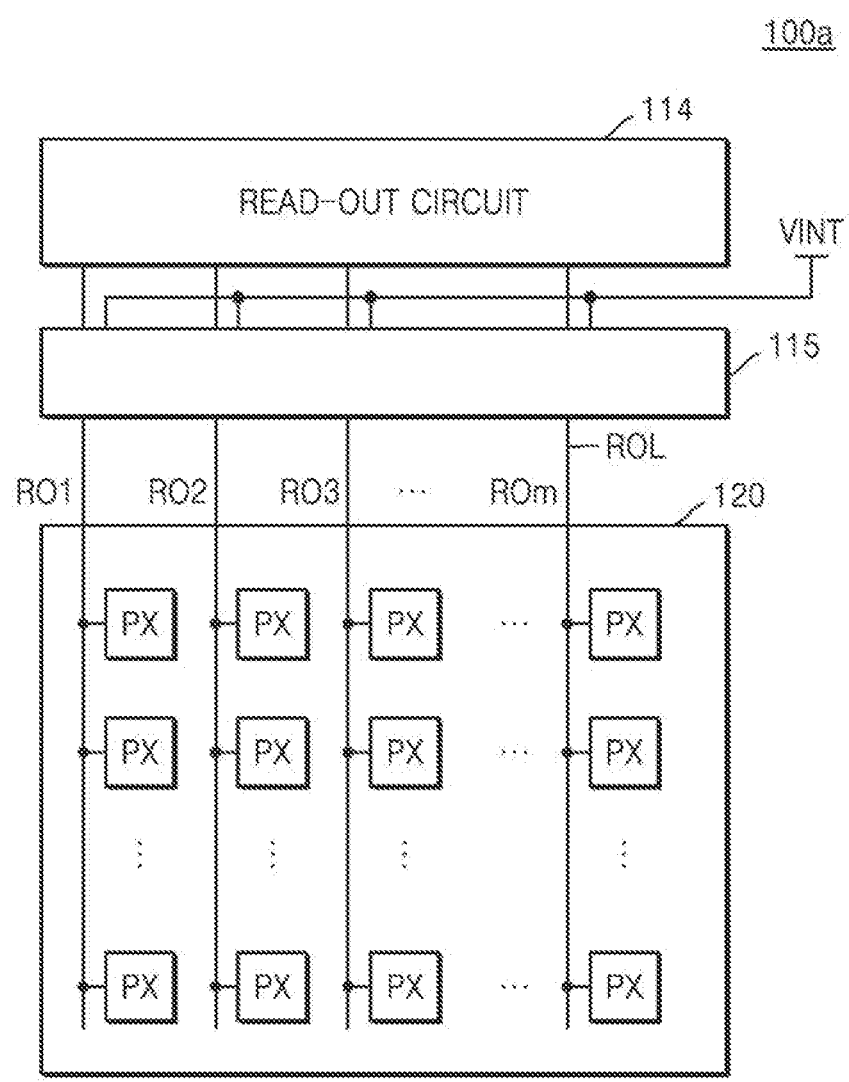
FIG. 4 is a block diagram illustrating a display device according to an example embodiment.

FIG. 4 is a block diagram illustrating a display device according to an example embodiment.

Referring to FIG. 4, a display device 100a may include a read-out circuit 114, a selection circuit 115, and a display panel 120. Although the read-out circuit 114, the selection circuit 115, and the display panel 120 are illustrated in FIG. 4 for the sake of convenience of description, the display device 100a may further include other components, for example, the control logic circuit 111, the data driver 112, and the scan driver 113 of the display device 100 of FIG. 1.

Referring to FIGS. 1, 2, and 4, the display drive circuit 110 may further include a selection circuit 115. The selection circuit 115 may connect the read-out line ROL to the initialization power supply VINT or connect the read-out line ROL to the read-out circuit 114. That is, the selection circuit 115 may connect the read-out line ROL to either the initialization power supply VINT or the read-out circuit 114.

In a reset period, the selection circuit 115 may electrically connect the read-out line ROL to the initialization power supply VINT. In the reset period, the selection circuit 115 may provide a voltage of the initialization power supply VINT to the pixel PX through the read-out line ROL.

In a read-out period, the selection circuit 115 may electrically connect the read-out line ROL to the read-out circuit 114. In the read-out period, the selection circuit 115 may transmit a plurality of read-out signals RO1 to ROm received through the plurality of read-out lines ROL to the read-out circuit 114.

Figure 5:
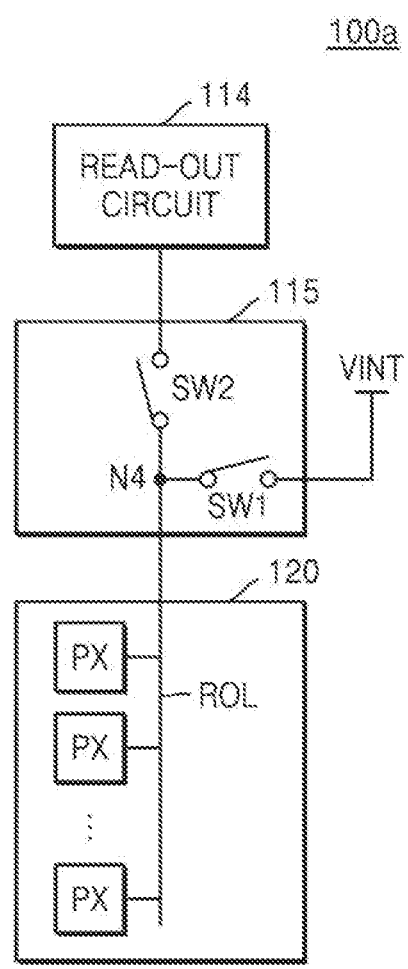
FIG. 5 is a block diagram illustrating a display device according to an example embodiment.

FIG. 5 is a block diagram illustrating a display device according to an example embodiment.

Although FIG. 5 illustrates only one column of pixels and illustrates a read-out circuit 114, a selection circuit 115, and a display panel 120 for the sake of convenience of description, a display device 100a may further include other components, for example, a control logic circuit 111, a data driver 112, and a scan driver 113 of the display device 100 of FIG. 1.

A first switch SW1 may be connected between a fourth node N4 and an initialization power supply VINT. The first switch SW1 may be connected between a read-out line ROL and an initialization power supply node to which an initialization voltage is supplied. A second switch SW2 may be connected between the fourth node N4 and the read-out circuit 114. The second switch SW2 may be connected between the read-out line ROL and the read-out circuit 114. A pixel PX may be connected to the fourth node N4 through a corresponding read-out line ROL.

In one example embodiment, the scan driver 113 of FIG. 1 may control the first switch SW1 and the second switch SW2. The scan driver 113 may output signals for driving the first switch SW1 and the second switch SW2.

In a reset period, the first switch SW1 may be turned on and the second switch SW2 may be turned off. When the first switch SW1 is turned on and the second switch SW2 is turned off, a voltage of the initialization power supply VINT may be provided to the pixel PX through the read-out line ROL.

In a read-out period, the first switch SW1 may be turned off and the second switch SW2 may be turned on. When the first switch SW1 is turned off and the second switch SW2 is turned on, the read-out signals RO1 to ROm may be output to the read-out circuit 114 through the read-out line ROL.

In a first read-out period, the read-out circuit 114 may generate data corresponding to a drive current based on a signal received through the read-out line ROL. In a second read-out period, the read-out circuit 114 may generate data corresponding to a threshold voltage based on a signal received through the read-out line ROL. In a third read-out period, the read-out circuit 114 may generate data corresponding to a forward voltage based on a signal received through the read-out line ROL.

Figure 6:
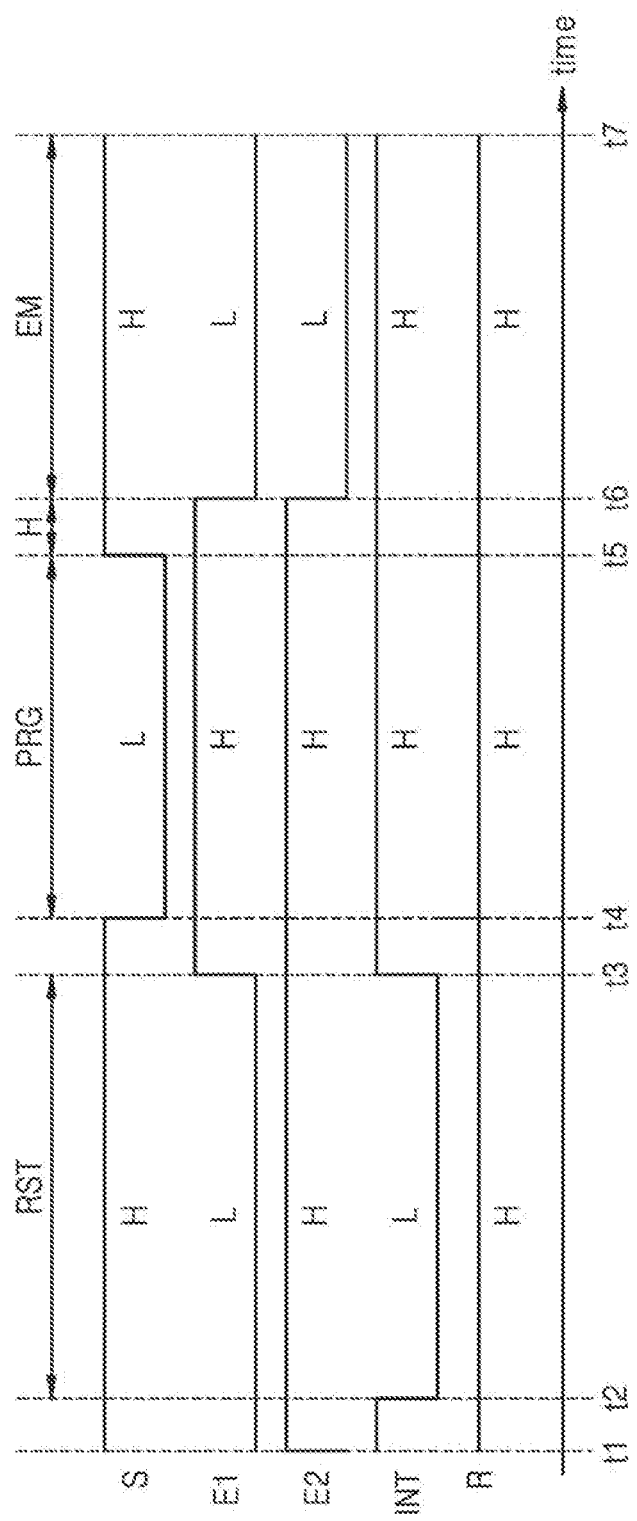
FIG. 6 is a timing diagram illustrating a plurality of signals for controlling a pixel, according to an example embodiment.

FIG. 6 is a timing diagram illustrating a plurality of signals for controlling a pixel according to an example embodiment. FIGS. 7A to 7D are diagrams illustrating operations of a pixel according to an example embodiment. A plurality of signals may be provided to the pixel PX of FIG. 2 and are described with reference to FIG. 2.

The scan driver 113 may provide a plurality of control signals to the display panel 120 through a plurality of control lines. The scan driver 113 may control the pixel PX through the plurality of control signals.

A scan signal S may be at a logic high level (for example, a high level, a first level, an inactive level, or a turn-off level) from a first point in time t1 to a fourth point in time t4, be at a logic low level (for example, a low level, a second level, an active level, or a turn-on level) from the fourth point in time t4 to a fifth point in time t5, and be at a logic high level after the fifth point in time t5. At the fourth point in time t4, the scan signal S may transition from a logic high level to a logic low level, and at the fifth point in time t5, the scan signal S may transition from a logic low level to a logic high level.

A first light emission control signal E1 may be at a logic low level from the first point in time t1 to a third point in time t3, be at a logic high level from the third point in time t3 to a sixth point in time t6, and be at a logic low level after the sixth point in time t6. The first light emission control signal E1 may transition from a logic low level to a logic high level at the third point in time t3 and may transition from a logic high level to a logic low level at the sixth point in time t6.

A second light emission control signal E2 may be at a logic high level from the first point in time t1 to the sixth point in time t6 and may be at a logic low level after the sixth point in time t6. The second light emission control signal E2 may transition from a logic low level to a logic high level at the first point in time t1. The second light emission control signal E2 may transition from a logic high level to a logic low level at the sixth point in time t6.

An initialization signal INT may be at a logic high level from the first point in time t1 to a second point in time t2, be at a logic low level from the second point in time t2 to the third point in time t3, and be at a logic high level after the third point in time t3. The initialization signal INT may transition from a logic high level to a logic low level at the second point in time t2 and may transition from a logic low level to a logic high level at the third point in time t3.

A read-out control signal R may be at a logic high level after the first point in time t1.

A reset period RST may be from the second point in time t2 to the third point in time t3, a program period PRG may be from the fourth point in time t4 to the fifth point in time t5, a hold period H may be from the fifth point in time t5 to the sixth point in time t6, and a light emission period EM may be from the sixth point in time t6 to a seventh point in time t7.

Figure 7A:
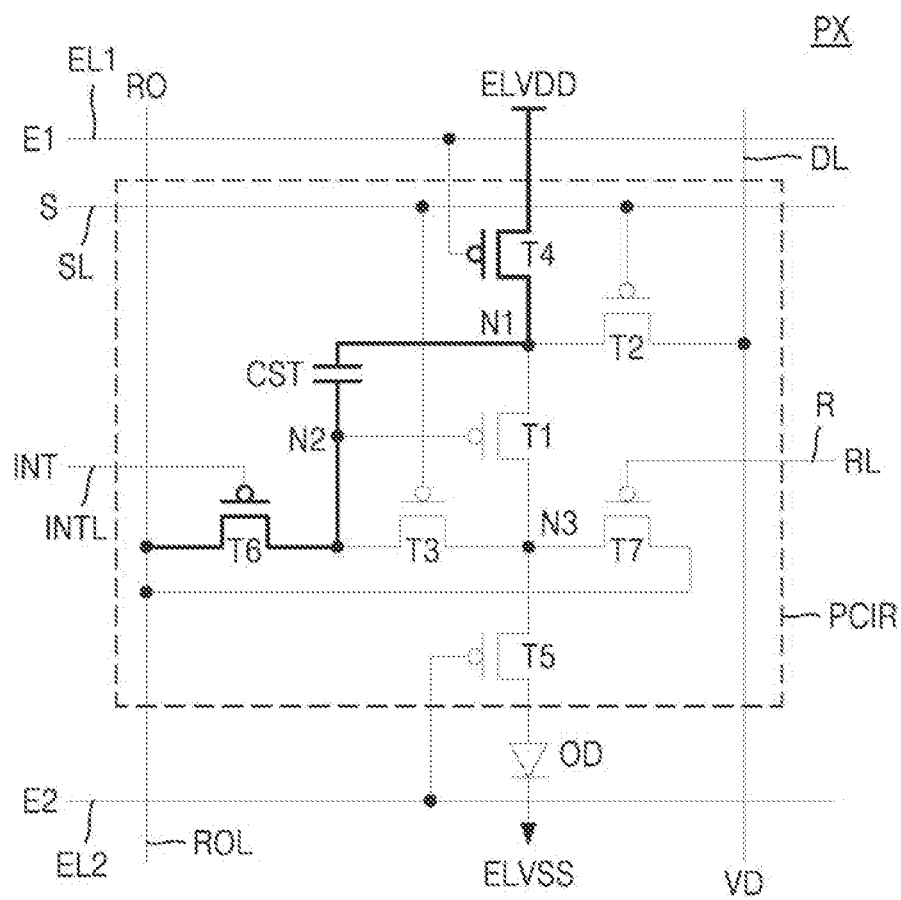
FIGS. 7A, 7B, 7C and 7D are diagrams illustrating operations of a pixel, according to an example embodiment.

Referring to FIGS. 6 and 7A, in the reset period RST, the scan signal S may be at a logic high level, the first light emission control signal E1 may be at a logic low level, the second light emission control signal E2 may be at a logic high level, the initialization signal INT may be at a logic low level, and the read-out control signal R may be at a logic high level. In this regard, in the reset period RST, the scan driver 113 may output the scan signal S at an inactive level (for example, a logic high level) through a scan line SL, output the first light emission control signal E1 at an active level through a first light emission control line EL1, output the second light emission control signal E2 at an inactive level through a second light emission control line EL2, output the initialization signal INT at an active level through an initialization line INTL, and the read-out control signal R at an inactive level through a read-out control line RL. Accordingly, in the reset period RST, the second transistor T2, the third transistor T3, the fifth transistor T5, and the seventh transistor T7 may be turned off, and the fourth transistor T4 and the sixth transistor T6 may be turned on.

The second transistor T2 may be turned off in response to the scan signal S at an inactive level. As the second transistor T2 is turned off, an electrical connection between the data line DL and the first node N1 may be disconnected. The third transistor T3 may be turned off in response to the scan signal S at an inactive level. As the third transistor T3 is turned off, an electrical connection between the second node N2 and the third node N3 may be disconnected. The fifth transistor T5 may be turned off in response to the second light emission control signal E2 at an inactive level. As the fifth transistor T5 is turned off, an electrical connection between the third node N3 and the OLED OD may be disconnected. The seventh transistor T7 may be turned off in response to the read-out control signal R at an inactive level. As the seventh transistor T7 is turned off, an electrical connection between the read-out line ROL and the third node N3 may be disconnected.

The fourth transistor T4 may be turned on in response to the first light emission control signal E1 at an active level. As the fourth transistor T4 is turned on, a voltage of the first drive power supply ELVDD may be provided to the first node N1. The sixth transistor T6 may be turned on in response to the initialization signal INT of an activation level. As the sixth transistor T6 is turned on, a voltage of the initialization power supply VINT provided through the read-out line ROL may be provided to the second node N2. That is, a voltage of a gate of the first transistor T1 may be initialized to the voltage of the initialization power supply VINT.

The storage capacitor CST may be charged with a voltage obtained by subtracting the voltage of the initialization power supply VINT from the voltage of the first drive power supply ELVDD. That is, the storage capacitor CST may store a difference voltage between the voltage of the first drive power supply ELVDD and the voltage of the initialization power supply VINT.

Figure 7B:
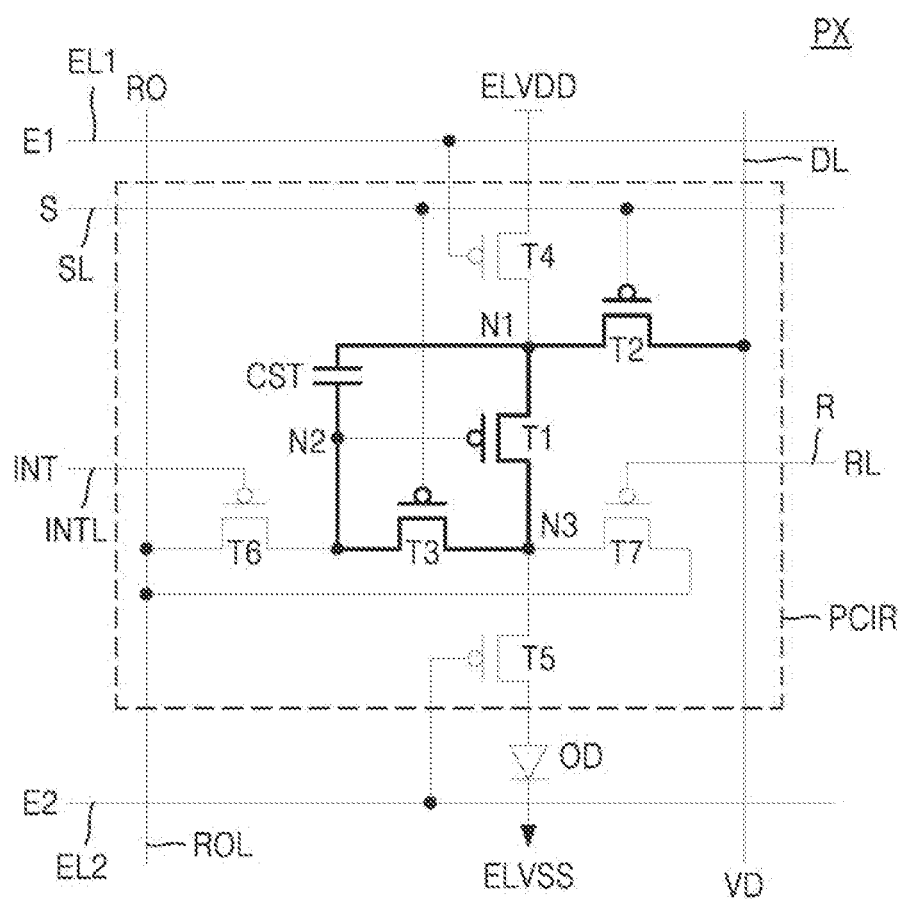

Referring to FIGS. 6 and 7B, in the program period PRG, the scan signal S may be at a logic low level, the first light emission control signal E1 may be at a logic high level, the second light emission control signal E2 may be at a logic high level, the initialization signal INT may be at a logic high level, and the read-out control signal R may be at a logic high level. In this regard, in the program period PRG, the scan driver 113 may output the scan signal S at an active level through the scan line SL, output the first light emission control signal E1 at an inactive level through the first light emission control line EL1, output the second light emission control signal E2 at an inactive level through the second light emission control line EL2, output the initialization signal INT at an inactive level through the initialization line INTL, and output the read-out control signal R at an inactive level through the read-out control line RL.

In the program period PRG, the fourth transistor T4, the fifth transistor T5, the sixth transistor T6, and the seventh transistor T7 may be turned off, and the second transistor T2 and the third transistor T3 may be turned on.

The fourth transistor T4 may be turned off in response to the first light emission control signal E1 at an inactive level. As the fourth transistor T4 is turned off, an electrical connection between the first drive power supply ELVDD and the first node N1 may be disconnected. The fifth transistor T5 may be turned off in response to the second light emission control signal E2 at an inactive level. As the fifth transistor T5 is turned off, an electrical connection between the third node N3 and the OLED OD may be disconnected. The sixth transistor T6 may be turned off in response to the initialization signal INT at an inactive level. As the sixth transistor T6 is turned off, an electrical connection between the read-out line ROL and the second node N2 may be disconnected. The seventh transistor T7 may be turned off in response to the read-out control signal R at an inactive level. As the seventh transistor T7 is turned off, an electrical connection between the read-out line ROL and the third node N3 may be disconnected.

The second transistor T2 may be turned on in response to the scan signal S at an active level. As the second transistor T2 is turned on, the data voltage VD provided through the data line DL may be provided to the first node N1. The third transistor T3 may be turned on in response to the scan signal S at an active level. As the third transistor T3 may be turned on, the second node N2 may be connected to the third node N3, and accordingly, the first transistor T1 may operate as a diode.

The data voltage VD may be applied to the first node N1, and a voltage obtained by subtracting an absolute value of the threshold voltage VTH from the data voltage VD may be applied to the second node N2. The storage capacitor CST may be charged with the threshold voltage VTH. That is, the storage capacitor CST may store the threshold voltage VTH.

Figure 7C:
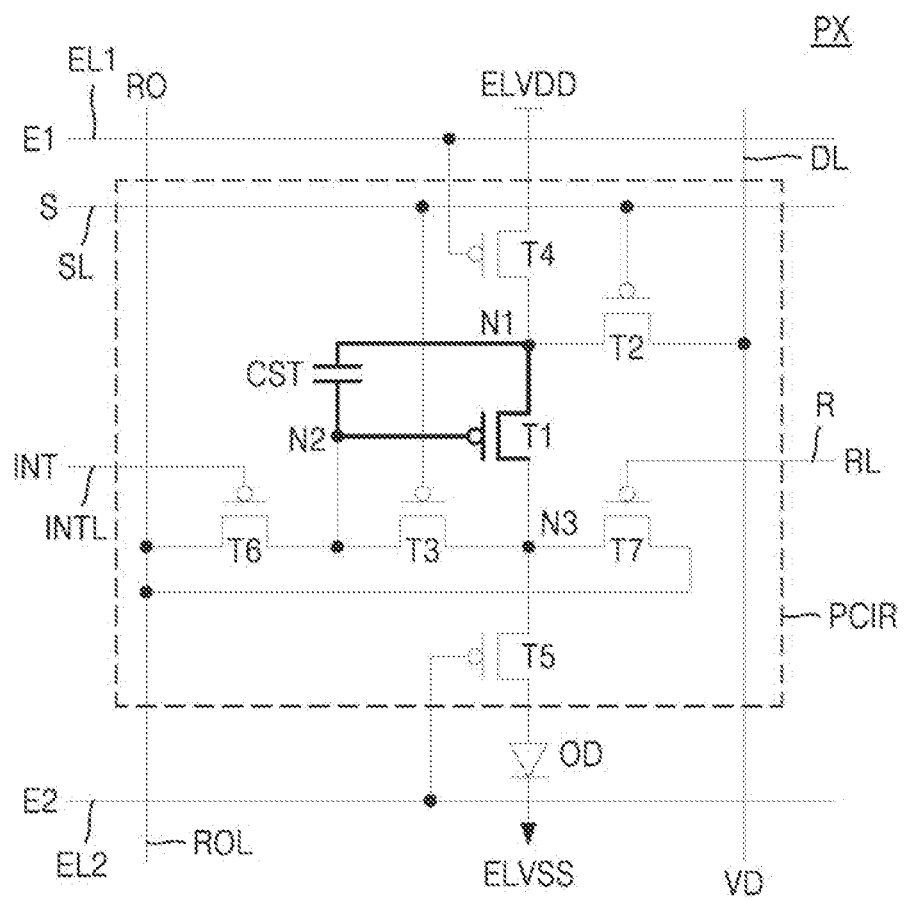

Referring to FIGS. 6 and 7C, in the hold period H, the scan signal S may be at a logic high level, the first light emission control signal E1 may be at a logic high level, the second light emission control signal E2 may be at a logic high level, the initialization signal INT may be at a logic high level, and the read-out control signal R may be at a logic high level. In this regard, in the hold period H, the scan driver 113 may output the scan signal S at an inactive level through the scan line SL, output the first light emission control signal E1 at an inactive level through the first light emission control line EL1, output the second light emission control signal E2 at an inactive level through the second light emission control line EL2, output the initialization signal INT at an inactive level through the initialization line INTL, and output the read-out control signal R at an inactive level through the read-out control line RL.

In the hold period H, the second transistor T2, the third transistor T3, the fourth transistor T4, the fifth transistor T5, the sixth transistor T6, and the seventh transistor T7 may be turned off.

The second transistor T2 may be turned off in response to the scan signal S at an inactive level. As the second transistor T2 is turned off, an electrical connection between the data line DL and the first node N1 may be disconnected. The third transistor T3 may be turned off in response to the scan signal S at an inactive level. As the third transistor T3 is turned off, an electrical connection between the second node N2 and the third node N3 may be disconnected. The fourth transistor T4 may be turned off in response to the first light emission control signal E1 at an inactive level. As the fourth transistor T4 is turned off, an electrical connection between the first drive power supply ELVDD and the first node N1 may be disconnected. The fifth transistor T5 may be turned off in response to the second light emission control signal E2 at an inactive level. As the fifth transistor T5 is turned off, an electrical connection between the third node N3 and the OLED OD may be disconnected. The sixth transistor T6 may be turned off in response to the initialization signal INT at an inactive level. As the sixth transistor T6 is turned off, an electrical connection between the read-out line ROL and the second node N2 may be disconnected. The seventh transistor T7 may be turned off in response to the read-out control signal R at an inactive level. As the seventh transistor T7 is turned off, an electrical connection between the read-out line ROL and the third node N3 may be disconnected.

In one example embodiment, a range of the data voltage VD may be extended due to the influence of e. A first parasitic capacitor may be between a gate of the second transistor T2 and a second electrode (that is, the first node N1) of the second transistor T2. When the scan signal S transitions from a logic low level to a logic high level at the fifth point in time t5 (that is, at a rising edge), a voltage of the first node N1 may be coupled to the scan signal S through the first parasitic capacitor, and may thereby be increased. A first voltage V1 may be applied to the first node N1. The first voltage V1 may be represented by Equation 2. In Equation 2, VD indicates the data voltage VD applied through the data line DL, and f(A) indicates the magnitude of a voltage increased by the first parasitic capacitor.

$$V1 = VD + f(A) \qquad \text{Equation 2}$$

A second parasitic capacitor may be between a gate of the third transistor T3 and a first electrode (that is, the second node N2) of the third transistor T3. When the scan signal S transitions from a logic low level to a logic high level at the fifth point in time t5, a voltage of the second node N2 may be coupled to the scan signal S through the second parasitic capacitor, and may thereby be increased. A second voltage V2 may be applied to the second node N2. The second voltage V2 may be represented by Equation 3. In Equation 3, VD indicates the data voltage VD applied through the data line DL, and f(B) indicates the magnitude of a voltage increased by the second parasitic capacitor.

$$V2 = VD - |VTH| + f(B) \qquad \text{Equation 3}$$

Figure 7D:
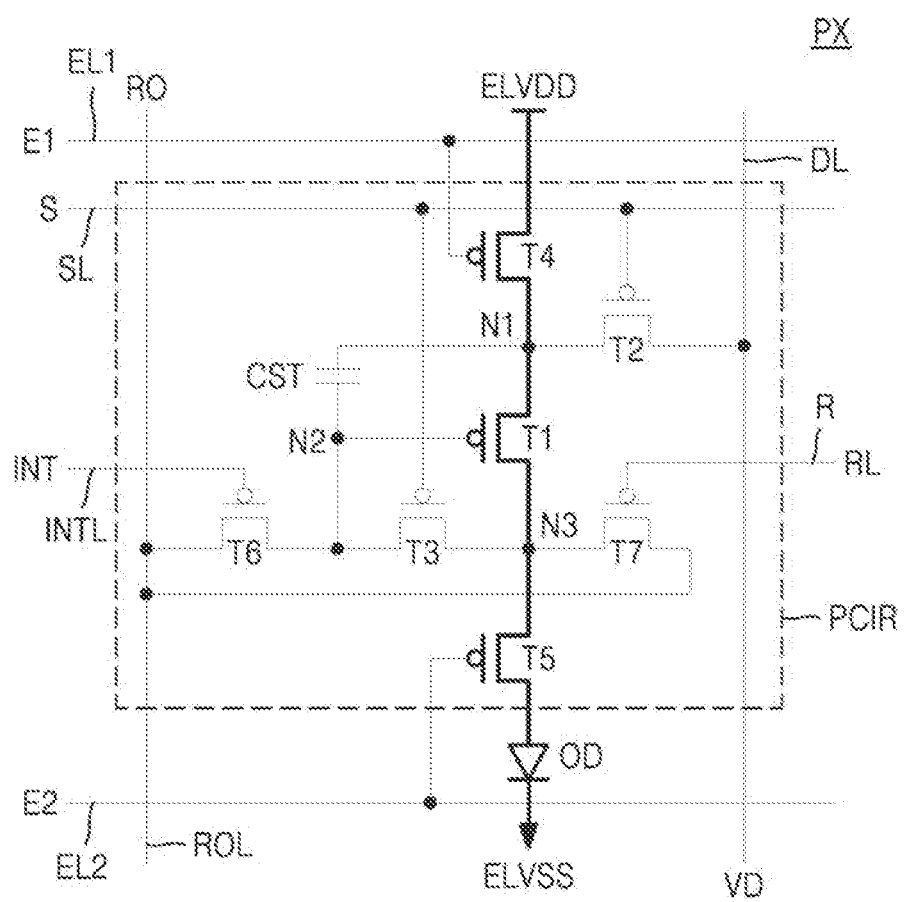

Referring to FIGS. 6 and 7D, in the light emission period EM, the scan signal S may be at a logic high level, the first light emission control signal E1 may be a logic low level, the second light emission control signal E2 may be a logic low level, the initialization signal INT may be a logic high level, and the read-out control signal R may be a logic high level. In the light emission period EM, the scan driver 113 may output the scan signal S at an inactive level through the scan line SL, output the first light emission control signal E1 at an active level through the first light emission control line EL1, output the second light emission control signal E2 at an active level through the second light emission control line EL2, output the initialization signal INT at an inactive level through the initialization line INTL, and output the read-out control signal R at an inactive level through the read-out control line RL. In the light emission period EM, the second transistor T2, the third transistor T3, the sixth transistor T6, and the seventh transistor T7 may be turned off, and the fourth transistor T4 and the fifth transistor T5 may be turned on. The first transistor T1 may operate according to a voltage of the second node N2.

The second transistor T2 may be turned off in response to the scan signal S at an inactive level. As the second transistor T2 is turned off, an electrical connection between the data line DL and the first node N1 may be disconnected. The third transistor T3 may be turned off in response to the scan signal S at an inactive level. As the third transistor T3 is turned off, an electrical connection between the second node N2 and the third node N3 may be disconnected. The sixth transistor T6 may be turned off in response to the initialization signal INT at an inactive level. As the sixth transistor T6 is turned off, an electrical connection between the read-out line ROL and the second node N2 may be disconnected. The seventh transistor T7 may be turned off in response to the read-out control signal R at an inactive level. As the seventh transistor T7 is turned off, an electrical connection between the read-out line ROL and the third node N3 may be disconnected.

The fourth transistor T4 may be turned on in response to the first light emission control signal E1 at an active level. The fifth transistor T5 may be turned on in response to the second light emission control signal E2 at an active level. Both the fourth transistor T4 and the fifth transistor T5 may be turned on, and the first transistor T1 may operate according to a voltage of the second node N2. Accordingly, the drive current ID corresponding to the data voltage VD may flow through the OLED OD.

When a drive current ID is supplied from the first transistor T1 to the OLED OD, the OLED OD may emit light from an organic light emitting layer. The intensity of light may be proportional to the drive current ID. For example, the voltage of the first drive power supply ELVDD may be e applied to the first node N1. The third voltage V3 may be applied to the second node N2. The third voltage V3 may be represented by Equation 4. In Equations 4, α indicates a constant value, ELVDD indicates a voltage of the first drive power supply ELVDD, VD indicates the data voltage VD, VSG indicates a drive voltage VSG of the first transistor T1, VTH indicates the threshold voltage VTH of the first transistor T1, f(A) indicates the magnitude of a voltage increased by the first parasitic capacitor, and f(B) indicates the magnitude of a voltage increased by the second parasitic capacitor.

$$V3 = VD - |VTH| + f(B) + \alpha(ELVDD - VD - f(A)) \qquad \text{Equation 4}$$

A drive voltage VSG of the first transistor T1 may be represented by Equation 5, and the drive current ID may be represented by Equation 6. In Equations 5 and 6, a indicates a constant value, ELVDD indicates a voltage of the first drive power supply ELVDD, VD indicates the data voltage VD, VSG indicates a drive voltage VSG of the first transistor T1, VTH indicates the threshold voltage VTH of the first transistor T1, f(A) indicates the magnitude of a voltage increased by the first parasitic capacitor, and f(B) indicates the magnitude of a voltage increased by the second parasitic capacitor.

$$VSG = (1 - \alpha)(ELVDD - VD) - f(B) + \alpha f(A) + |VTH| \qquad \text{Equation 5}$$

$$ID = \beta(VSG - VTH)^2 \qquad \text{Equation 6}$$

The display device 100 according to an example embodiment may extend the range of data voltage VD by being implemented as represented by Equation 7. In Equation 7, f(A) indicates the magnitude of a voltage increased by the first parasitic capacitor, and f(B) indicates the magnitude of a voltage increased by the second parasitic capacitor.

$$f(A) < f(B) \qquad \text{Equation 7}$$

In one example embodiment, a size of the second transistor T2 may be different from a size of the third transistor T3. The size of the second transistor T2 may be less than the size of the third transistor T3. Due to the difference in size of transistors, effects of parasitic capacitors may be different from each other. Due to the difference in size of transistors, the effect of the second parasitic capacitor may be greater than the effect of the first parasitic capacitor. A drive voltage VSG of the first transistor T1 may be reduced due to the influence of a parasitic capacitor (e.g. f(B)). That is, compared to the case without the parasitic capacitor, the drive voltage VSG is reduced even if the same data voltage VD is applied, so the range of the data voltage can be expanded.

As described above, a range of a data voltage corresponding to a range of a current flowing through a pixel may be increased. That is, a change range of the data voltage VD corresponding to the change range of the drive current ID may be extended. It may be easy to control the brightness or luminance of pixels by using a data voltage.

Figure 8:
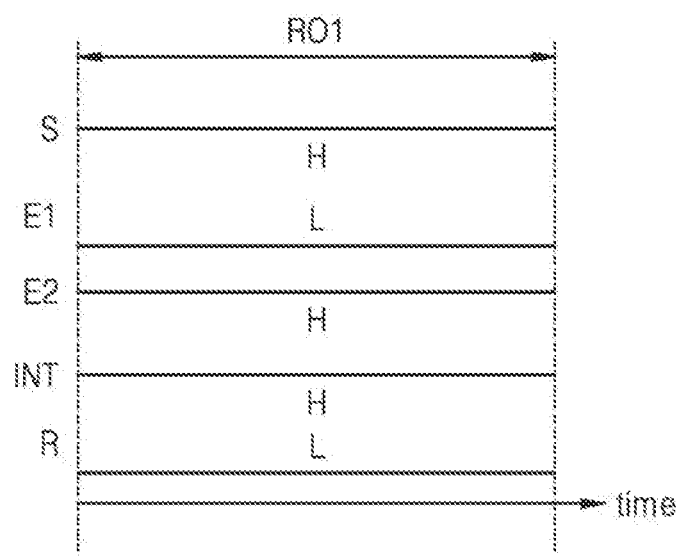
FIGS. 8 to 10 are timing diagrams illustrating a plurality of signals for controlling a pixel, according to an embodiment.
Figure 9:
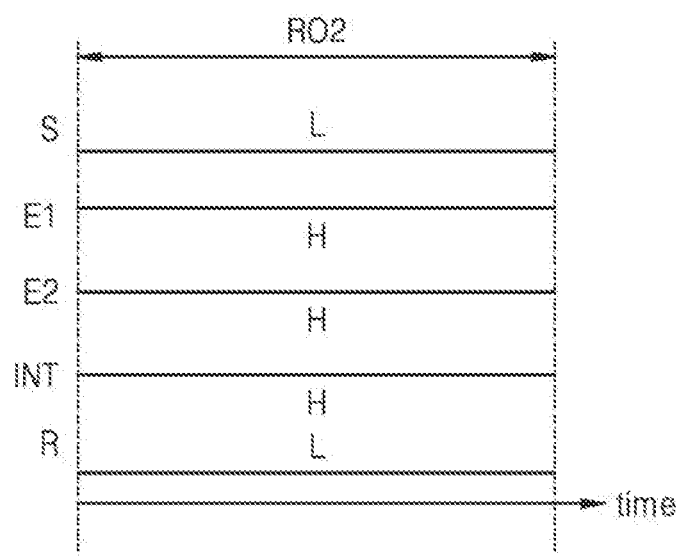
Figure 10:
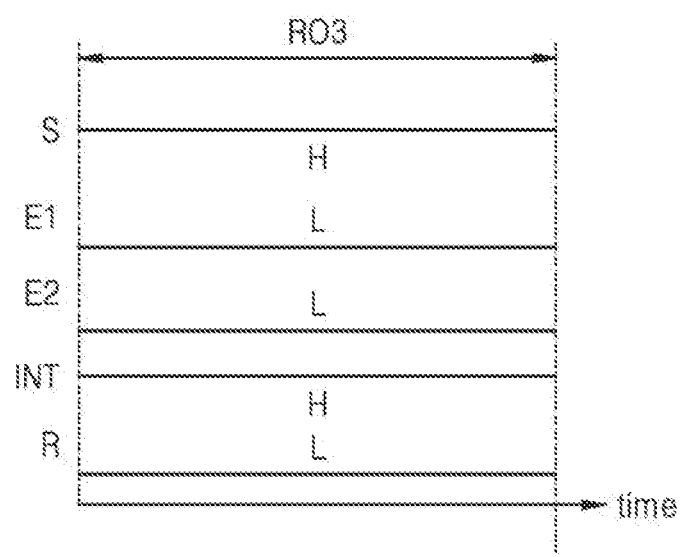
Figure 11A:
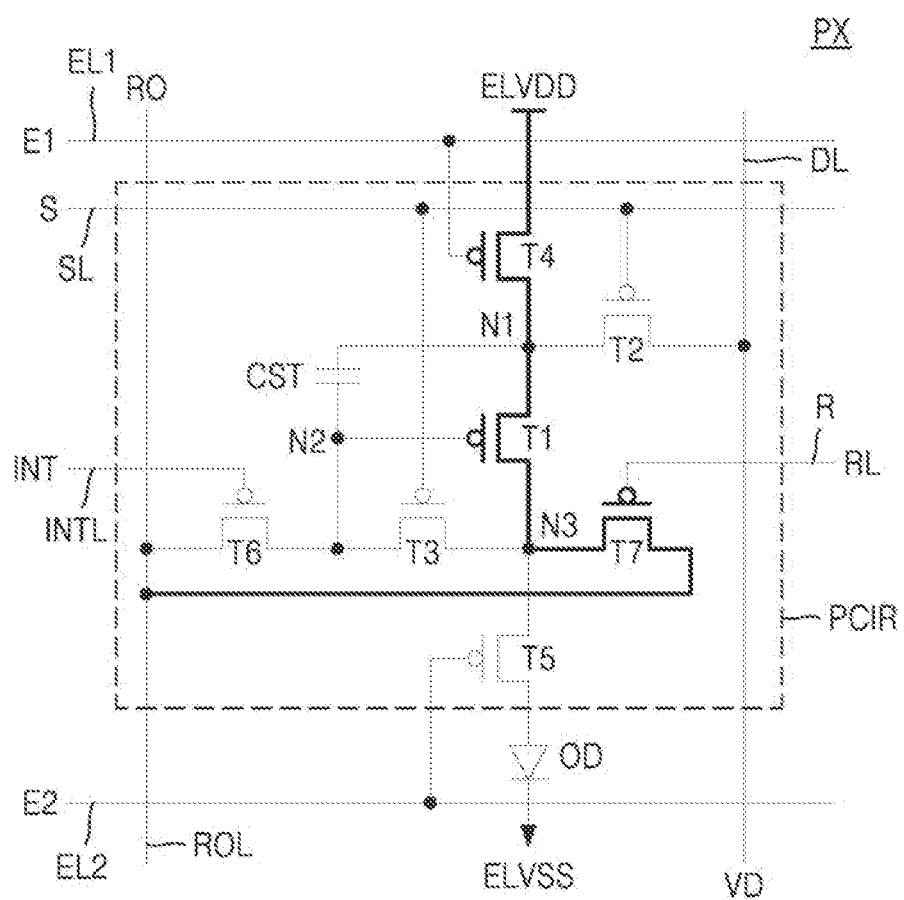
FIGS. 11A, 11B and 11C are diagrams illustrating operations of a pixel, according to an embodiment.
Figure 11B:
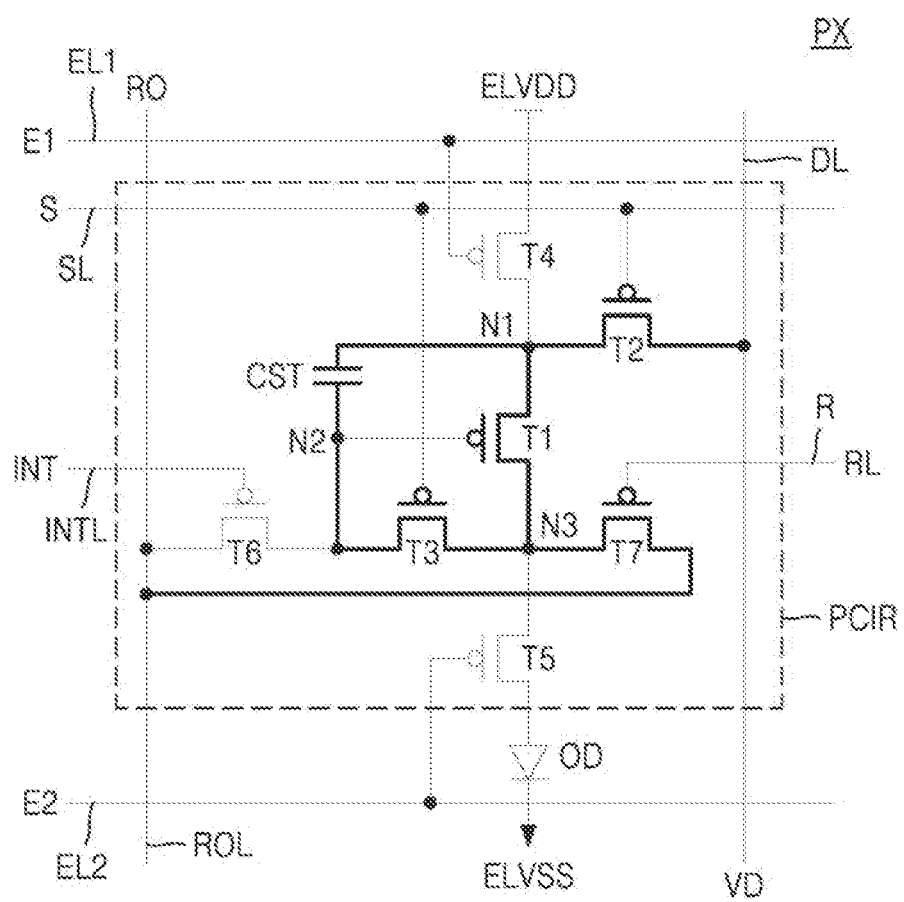
Figure 11C:
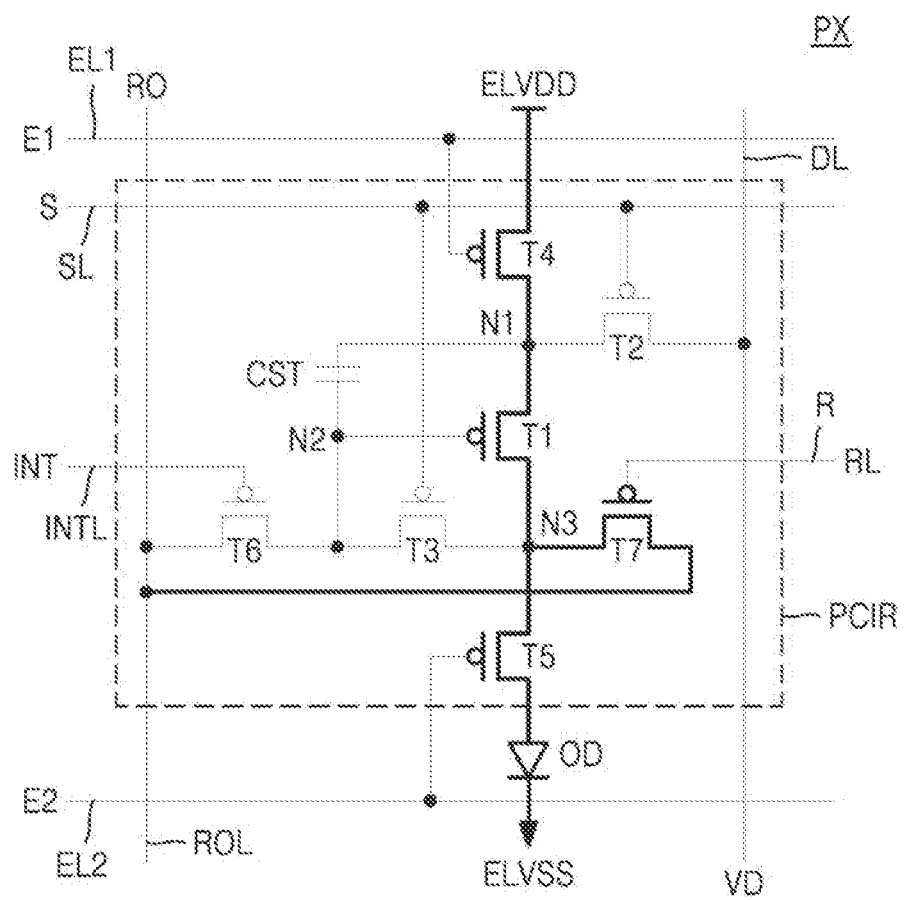

FIGS. 8 to 10 are timing diagrams illustrating a plurality of signals for controlling a pixel according to an example embodiment. FIGS. 11A to 11C are diagrams illustrating operations of a pixel according to an example embodiment. A plurality of signals may be provided to the pixel PX of FIG. 2 and are described with reference to FIGS. 1 and 2 together.

In the read-out period, the pixel PX may output the read-out signal RO through the read-out line ROL. In the first read-out period RO1, the read-out circuit 114 may detect the drive current ID. After the hold period H, the display device 100 may perform a first read-out operation instead of a light emission operation. The first read-out operation may refer to an operation of detecting a drive current. The display device 100 may perform the first read-out operation in the first read-out period RO1. In the first read-out period RO1, the pixel PX may output the drive current ID to the read-out circuit 114 through the read-out line ROL.

In the second read-out period RO2, the read-out circuit 114 may detect the threshold voltage VTH. After the reset period RST, the display device 100 may perform a second read-out operation instead of a program operation. The second read-out operation may refer to an operation of detecting a threshold voltage. The display device 100 may perform the second read-out operation in the second read-out period RO2. In the second read-out period RO2, the pixel PX may output an output voltage VO to the read-out circuit 114. The output voltage VO may be represented by Equation 7. In Equation 7, VD may indicate the data voltage VD, and VTH may indicate the threshold voltage VTH of the first transistor T1.

$$VO = VD - VTH \qquad \text{Equation 7}$$

In the third read-out period RO3, the read-out circuit 114 may detect the forward voltage VF. After the hold period H, the display device 100 may perform a third read-out operation instead of a light emission operation. The third read-out operation may refer to an operation of detecting the forward voltage VF. The display device 100 may perform the third read-out operation in the third read-out period RO3. In the third read-out period RO3, the pixel PX may output the forward voltage VF (or a voltage of the third node N3) to the read-out circuit 114.

A method of measuring the drive current ID is described with reference to FIGS. 8 and 11A. Referring FIGS. 2, 8, and 11A, in the first read-out period RO1, the scan signal S may be at a logic high level, the first light emission control signal E1 may be at a logic low level, the second light emission control signal E2 may be at a logic high level, the initialization signal INT may be at a logic high level, and the read-out control signal R may be at a logic low level. In this regard, in the first read-out period RO1, the scan driver 113 may output the scan signal S at an inactive level through the scan line SL, output the first light emission control signal E1 at an active level through the first light emission control line EL1, output the second light emission control signal E2 at an inactive level through the second light emission control line EL2, output the initialization signal INT at an inactive level through the initialization line INTL, and output the read-out control signal R at an active level through the read-out control line RL. In the first read-out period RO1, the second transistor T2, the third transistor T3, the fifth transistor T5, and the sixth transistor T6 may be turned off, and the fourth transistor T4 and the seventh transistor T7 may be turned on.

The fourth transistor T4 may be turned on in response to the first light emission control signal E1 at an active level. The seventh transistor T7 may be turned on in response to the read-out control signal R at an active level. The fifth transistor T5 may be turned off in response to the second light emission control signal E2 at an inactive level. The second transistor T2 may be turned off in response to the scan signal S at an inactive level. The third transistor T3 may be turned off in response to the scan signal S at an inactive level. The sixth transistor T6 may be turned off in response to the initialization signal INT at an inactive level.

As the fifth transistor T5 is turned off and the seventh transistor T7 is turned on, the drive current ID (that is, the read-out signal RO) may be output to the read-out circuit 114 through the read-out line ROL. Thus, the read-out signal RO may correspond to operation of the first transistor T1, which operates according to a voltage of the second node N2. The read-out circuit 114 may receive the drive current ID through the read-out line ROL. The read-out circuit 114 may generate read-out data by performing analog-to-digital conversion of the received drive current ID.

A method of measuring the threshold voltage VTH is described with reference to FIGS. 9 and 11B. Referring to FIGS. 2, 9, and 11B, in the second read-out period RO2, the scan signal S may be at a logic low level, the first light emission control signal E1 may be at a logic high level, the second light emission control signal E2 may be at a logic high level, the initialization signal INT may be at a logic high level, and the read-out control signal R may be at a logic low level. In this regard, in the second read-out period RO2, the scan driver 113 may output the scan signal S at an active level through the scan line SL, output the first light emission control signal E1 at an inactive level through the first light emission control line EL1, output the second light emission control signal E2 at an inactive level through the second light emission control line EL2, output the initialization signal INT at an inactive level through the initialization line INTL, and output the read-out control signal R at an active level through the read-out control line RL. In the second read-out period RO2, the fourth transistor T4, the fifth transistor T5, and the sixth transistor T6 may be turned off, and the second transistor T2, the third transistor T3, and the seventh transistor T7 may be turned on.

The second transistor T2 may be turned on in response to the scan signal S at an active level. The third transistor T3 may be turned on in response to the scan signal S at an active level. The seventh transistor T7 may be turned on in response to the read-out control signal R at an active level. The fourth transistor T4 may be turned off in response to the first light emission control signal E1 at an inactive level. The fifth transistor T5 may be turned off in response to the second light emission control signal E2 at an inactive level. The sixth transistor T6 may be turned off in response to the initialization signal INT at an inactive level.

The second transistor T2 may be turned on in response to the scan signal S at an active level. As the second transistor T2 is turned on, the data voltage VD may be provided from the data line DL to the first node N1. The data voltage VD may be applied to the first node N1. A voltage obtained by subtracting an absolute value of the threshold voltage VTH from the data voltage VD may be applied to the second node N2.

The third transistor T3 may be turned on in response to the scan signal S at an active level. As the third transistor T3 is turned on, the second node N2 may be connected to the third node N3, and accordingly, the first transistor T1 may operate as a diode. Similarly to the second node N2, a voltage obtained by subtracting an absolute value of the threshold voltage VTH from the data voltage VD may be applied to the third node N3.

The seventh transistor T7 may be turned on in response to the read-out control signal R at an active level. As the seventh transistor T7 is turned on, the third node N3 may be electrically connected to the read-out line ROL. The output voltage VO may be output through the read-out line ROL. Thus, the read-out signal RO may correspond to operation of the first transistor T1, which operates according to a voltage of the second node N2.

The read-out circuit 114 may receive the output voltage VO through the read-out line ROL. The read-out circuit 114 may detect the threshold voltage VTH based on the output voltage VO and the data voltage VD. The read-out circuit 114 may generate read-out data by performing analog-to-digital conversion of the threshold voltage VTH.

A method of measuring the forward voltage VF is described with reference to FIGS. 10 and 11C. Referring to FIGS. 2, 10, and 11C, in the third read-out period RO3, the scan signal S may be at a logic high level, the first light emission control signal E1 may be at a logic low level, the second light emission control signal E2 may be at a logic low level, the initialization signal INT may be at a logic high level, and the read-out control signal R may be at a logic low level. In this regard, in the third read-out period RO3, the scan driver 113 may output the scan signal S at an inactive level through the scan line SL, output the first light emission control signal E1 at an active level through the first light emission control line EL1, output the second light emission control signal E2 at an active level through the second light emission control line EL2, output the initialization signal INT at an inactive level through the initialization line INTL, and output the read-out control signal R at an active level through the read-out control line RL. In the third read-out period RO3, the second transistor T2, the third transistor T3, and the sixth transistor T6 may be turned off, and the fourth transistor T4, the fifth transistor T5, and the seventh transistor T7 may be turned on.

The fourth transistor T4 may be turned on in response to the first light emission control signal E1 at an active level. The fifth transistor T5 may be turned on in response to the second light emission control signal E2 at an active level. The seventh transistor T7 may be turned on in response to the read-out control signal R at an active level. The second transistor T2 may be turned off in response to the scan signal S at an inactive level. The third transistor T3 may be turned off in response to the scan signal S at an inactive level. The sixth transistor T6 may be turned off in response to the initialization signal INT at an inactive level.

The fourth transistor T4 may be turned on in response to the first light emission control signal E1 at an active level. The fifth transistor T5 may be turned on in response to the second light emission control signal E2 at an active level. Both the fourth transistor T4 and the fifth transistor T5 may be turned, and accordingly, the drive current ID may flow through the OLED OD. The seventh transistor T7 may be turned on in response to the read-out control signal R at an active level. As the seventh transistor T7 is turned on, the third node N3 may be electrically connected to the read-out line ROL. The forward voltage VF may be output through the read-out line ROL. The read-out signal RO may correspond to operation of the first transistor T1, which operates according to a voltage of the second node N2.

The read-out circuit 114 may receive the forward voltage VF through the read-out line ROL. The read-out circuit 114 may generate read-out data by performing analog-to-digital conversion of the forward voltage VF.

As described above, the display device 100 may detect electrical characteristics of pixels in a test process. The display device 100 may measure (or check) the size and distribution of the drive current ID of the pixel PX. The display device 100 may measure the distribution of a drive transistor (that is, the first transistor T1) by measuring the threshold voltage VTH. Defects of pixels may be detected based on the drive current ID and the threshold voltage VTH, and current uniformity may be obtained. The display device 100 may measure the degree of degradation due to long-time use of the OLED OD by measuring the forward voltage VF. In this way, the display device 100 may obtain testability of the pixel PX even in a wafer or a package state by applying design for testability (DFT). Accordingly, quality of a semiconductor chip may be maintained, and test efficiency may be improved.

Figure 12A:
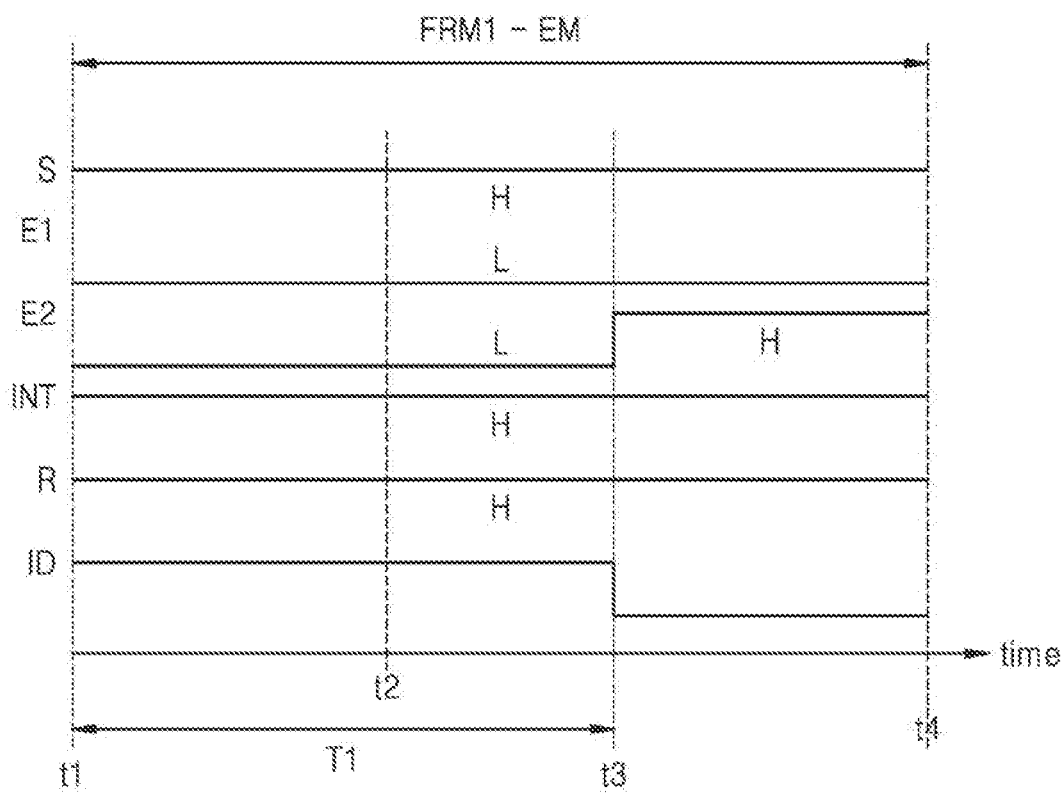
FIGS. 12A, 12B and 12C are timing diagrams illustrating a plurality of signals for controlling a pixel, according to an example embodiment.
Figure 12B:
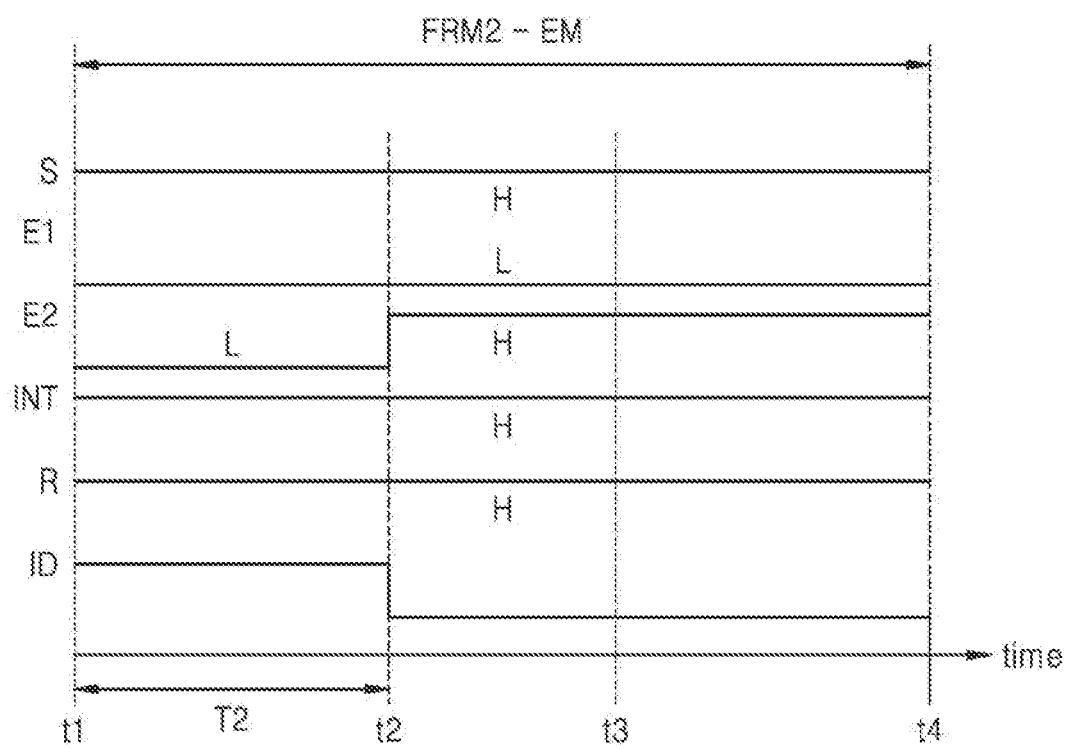
Figure 12C:
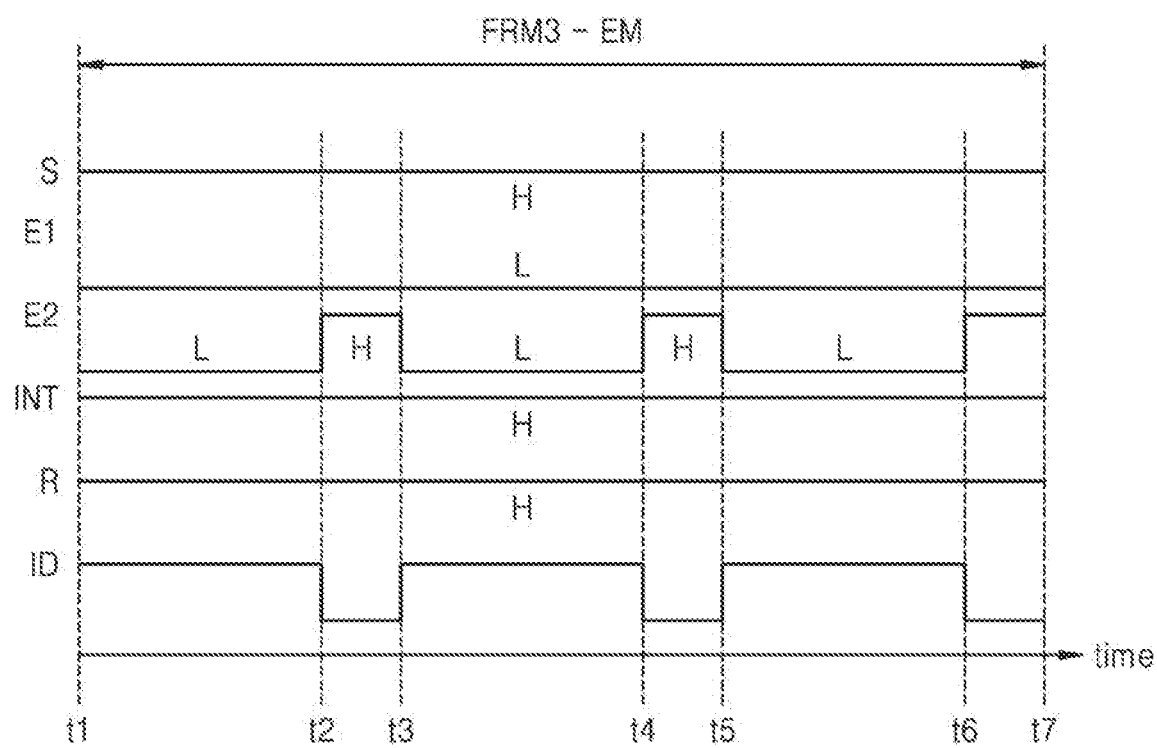

FIGS. 12A to 12C are timing diagrams illustrating a plurality of signals for controlling a pixel according to an example embodiment.

Referring to FIG. 6, the second light emission control signal E2 may maintain a logic low level in the light emission period EM. In addition, referring to FIGS. 12A to 12C, the second light emission control signal E2 may be at a logic high level in the light emission period EM.

FIG. 12A illustrates the light emission period EM of a first frame FRM1, FIG. 12B illustrates the light emission period EM of a second frame FRM2, and FIG. 12C illustrates the light emission period EM of a third frame FRM3. It is assumed that luminance of the first frame FRM1 is greater than luminance of the second frame FRM2.

Referring to FIGS. 1, 2, and 12A, during a period from the first point in time t1 to the fourth point in time t4, the scan signal S may be at a logic high level, the first light emission control signal E1 may be at a logic low level, the initialization signal INT may be at a logic high level, and the read-out control signal R may be at a logic high level.

The second light emission control signal E2 may be at a logic low level from the first point in time t1 to the third point in time t3, and the second light emission control signal E2 may be at a logic high level from the third point in time t3 to the fourth point in time t4. The second light emission control signal E2 may be at an active level for the first time period T1.

In this regard, during the light emission period EM, the scan driver 113 may output the scan signal S at an inactive level through the scan line SL, output the first light emission control signal E1 at an active level through the first light emission control line EL1, output the initialization signal INT at an inactive level through the initialization line INTL, and output the read-out control signal R at an inactive level through the read-out control line RL. The scan driver 113 may output the second light emission control signal E2 at an active level through the second light emission control line EL2 from the first point in time t1 to the third point in time t3 in the light emission period EM, and output the second light emission control signal E2 at an inactive level through the second light emission control line EL2 from the third point in time t3 to the fourth point in time t4 in the light emission period EM.

During the light emission period EM, the fourth transistor T4 may be turned on in response to the first light emission control signal E1 at an active level. The fifth transistor T5 may be turned on in response to the second light emission control signal E2 at an active level from the first point in time t1 to the third point in time t3. The fifth transistor T5 may be turned off in response to the second light emission control signal E2 at an inactive level from the third point in time t3 to the fourth point in time t4. The drive current ID may be supplied to the OLED OD from the first point in time t1 to the third point in time t3. The drive current ID may be blocked by the OLED OD from the third point in time t3 to the fourth point in time t4.

Referring to FIGS. 1, 2, and 12B, the scan signal S may be at a logic high level and the first light emission control signal E1 may be at a logic low level from the first point in time t1 to the fourth point in time t4. The initialization signal INT may be at a logic high level, and the read-out control signal R may be at a logic high level.

The second light emission control signal E2 may be at a logic low level from the first point in time t1 to the second point in time t2, and the second light emission control signal E2 may be at a logic high level from the second point in time t2 to the fourth point in time t4. The second light emission control signal E2 may be at an active level for the second time period T2. The second time period T2 may be less than the first time period T1.

During the light emission period EM, the fourth transistor T4 may be turned on in response to the first light emission control signal E1 at an active level. The fifth transistor T5 may be turned on in response to the second light emission control signal E2 at an active level from the first point in time t1 to the second point in time t2. The fifth transistor T5 may be turned off in response to the second light emission control signal E2 at an inactive level from the second point in time t2 to the fourth point in time t4. The drive current ID may be supplied to the OLED OD from the first point in time t1 to the second point in time t2. The drive current ID may be blocked by the OLED OD from the second point in time t2 to the fourth point in time t4.

The scan driver 113 may adjust the time period during which the second light emission control signal E2 is at an active level based on the set luminance. The second light emission control signal E2 may vary for each frame during the light emission period EM. For example, when the set luminance of the first frame FRM1 is different from the set luminance of the second frame FRM2, a period (for example, the first time period T1) of the first frame FRM1 during which the second light emission control signal E2 is at an active level may be different from a period (for example, the second time period T2) of the second frame FRM2 during which the second light emission control signal E2 is at an active level. The second light emission control signal E2 may vary according to the luminance set for each frame, and accordingly, the time (for example, dimming time) when the drive current ID flows may be adjusted. The pixel PX may output an optical signal having luminance according to the intensity of the drive current ID and the dimming time. The brightness of the OLED OD may be controlled by a voltage of the data line DL (that is, the data voltage VD) and the time period during which the second light emission control signal E2 is at an active level.

Referring to FIGS. 1, 2, and 12C, during a period from the first point in time t1 to the seventh point in time t7, the scan signal S may be at a logic high level, the first light emission control signal E1 may be at a logic low level, the initialization signal INT may be at a logic high level, and the read-out control signal R may be at a logic high level.

The second light emission control signal E2 may be at a logic low level from the first point in time t1 to the second point in time t2, be at a logic high level from the second point in time t2 to the third point in time t3, be at a logic low level from the third point in time t3 to the fourth point in time t4, be at a logic high level from the fourth point in time t4 to the fifth point in time t5, be at a logic low level from the fifth point in time t5 to the sixth point in time t6, and be at a logic high level after the sixth point in time t6.

During the light emission period EM, the fourth transistor T4 may be turned on in response to the first light emission control signal E1 at an active level. The fifth transistor T5 may be turned on in response to the second light emission control signal E2 at an active level from the first point in time t1 to the second point in time t2. The fifth transistor T5 may be turned off in response to the second light emission control signal E2 at an inactive level from the second point in time t2 to the third point in time t3. The fifth transistor T5 may be turned on in response to the second light emission control signal E2 at an active level from the third point in time t3 to the fourth point in time t4. The fifth transistor T5 may be turned off in response to the second light emission control signal E2 at an inactive level from the fourth point in time t4 to the fifth point in time t5. The fifth transistor T5 may be turned on in response to the second light emission control signal E2 at an active level from the fifth point in time t5 to the sixth point in time t6. The fifth transistor T5 may be turned off in response to the second light emission control signal E2 at an inactive level from the sixth point in time t6 to the seventh point in time t7.

The drive current ID may be supplied to the OLED OD from the first point in time t1 to the second point in time t2. The drive current ID may be blocked by the OLED OD from the second point in time t2 to the third point in time t3. The drive current ID may be supplied to the OLED OD from the third point in time t3 to the fourth point in time t4. The drive current ID may be blocked by the OLED OD from the fourth point in time t4 to the fifth point in time t5. The drive current ID may be supplied to the OLED OD from the fifth point in time t5 to the sixth point in time t6. The drive current ID may be blocked by the OLED OD from the sixth point in time t6 to the seventh point in time t7.

As described above, referring to FIG. 11A, the second light emission control signal E2 may be at an active level only during the first time period T1 of the light emission period EM. In addition, referring to FIG. 11C, the second light emission control signal E2 may be at an active level from the first point in time t1 to the second point in time t2, from the third point in time t3 to the fourth point in time t4, and from the fifth point in time t5 to the sixth point in time t6 in the light emission period EM. The second light emission control signal E2 may repeat a logic low level and a logic high level during the light emission period EM. By independently controlling the fourth transistor T4 and the fifth transistor T5, the display device 100 may implement the PWM. The display device 100 may control the light emission time of the OLED OD according to the second light emission control signal E2. The luminance may be adjusted according to the light emission time of the OLED OD. Accordingly, the display device 100 according to an example embodiment may improve brightness expressiveness (or grayscale).

Figure 13:
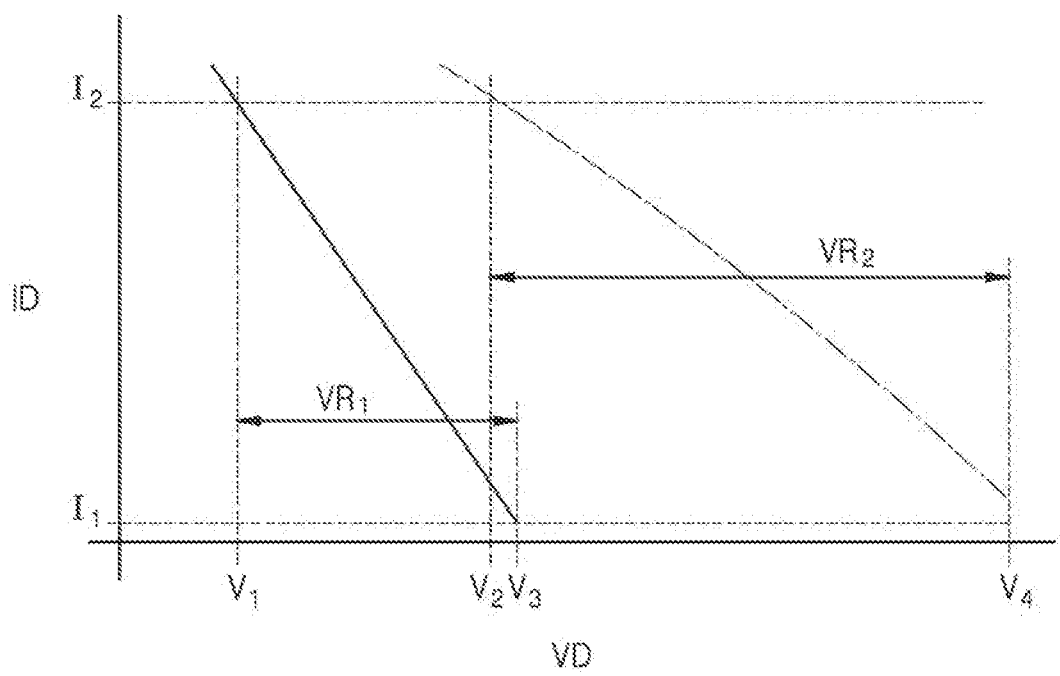
FIG. 13 is a diagram illustrating a change in a drive current corresponding to a change in a data voltage of a pixel according to an example embodiment.

FIG. 13 is a diagram illustrating an example of a change in a drive current corresponding to a change in a data voltage of a pixel.

A horizontal axis represents the data voltage VD, and a vertical axis represents the drive current ID. Referring to FIGS. 2, 3, and 13, a solid line represents a change in the drive current ID corresponding to a change in the data voltage VD of the pixel PXa of FIG. 3, and an alternated long and short dash line represents a change in the drive current ID corresponding to a change in the data voltage VD of the pixel PX of FIG. 2.

The OLED OD of the pixel PXa of FIG. 3 may be controlled when the drive current ID is within the range of a first current I1 to a second current I2. The data voltage VD corresponding to the change in the drive current ID for the pixel PXa of FIG. 3 may include a first voltage V1, a second voltage V2, and a third voltage V3. That is, a change range of the data voltage VD of the pixel PXa of FIG. 3 may be referred to as a first voltage range VR1.

The OLED OD of the pixel PX of FIG. 2 may be controlled when the drive current ID is in a range between the first current I1 and the second current I2. The data voltage VD corresponding to the change in the drive current ID for the pixel PX of FIG. 2 may include the second voltage V2 to a fourth voltage V4. That is, the change range of the data voltage VD of the pixel PX of FIG. 2 may be referred to as a second voltage range VR2. The second voltage range VR2 may be greater than the first voltage range VR1.

The storage capacitor CST of the pixel PXa of FIG. 3 may be connected between a gate of the first transistor T1 and the first drive power supply ELVDD. The storage capacitor CST of the pixel PX of FIG. 2 may be connected between the gate of the first transistor T1 and a second electrode of the fourth transistor T4 (that is, between the first transistor T1 and the fourth transistor T4). Accordingly, the change range of the data voltage VD corresponding to the change range of the current of the OLED OD may be extended. It is easier to control the luminance or brightness of the OLED OD by using the data voltage VD.

Figure 14:
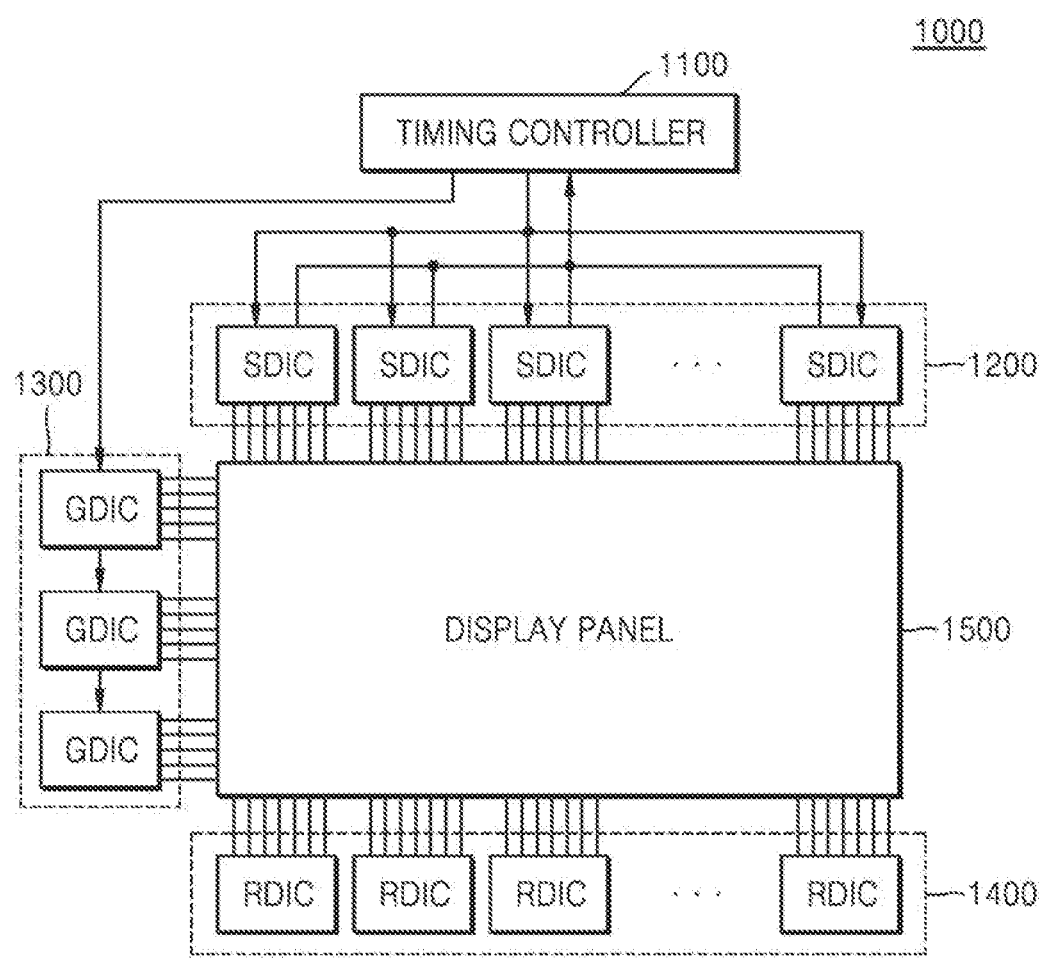
FIG. 14 illustrates a display device according to an example embodiment.

FIG. 14 illustrates a display device according to an example embodiment.

A display device 1000 of FIG. 14 may include a medium-large display panel 1500 and may be applied to, for example, a television and a monitor. Referring to FIG. 14, the display device 1000 may include a timing controller 1100, a source driver 1200, a gate driver 1300, a read-out circuit 1400, and a display panel 1500. The source driver 1200 may be the same as or similar to the data driver 112 of FIG. 1, the gate driver 1300 may be the same as or similar to the scan driver 113 of FIG. 1, and the timing controller 1100 may be the same as or similar to the control logic circuit 111 of FIG. 1.

The timing controller 1100 may be composed of one or more integrated circuits or modules. The timing controller 1100 may communicate with a plurality of source driver ICs (SDICs) and a plurality of gate driver ICs (GDICs) through a set interface.

The timing controller 1100 may generate control signals for controlling drive timings of the plurality of SDICs and the plurality of GDICs, and provide the control signals to the plurality of SDICs and the plurality of GDICs.

The source driver 1200 may include a plurality of source driver ICs (SDICs), and the plurality of source driver ICs (SDICs) may be mounted on a circuit film, such as a tape carrier package (TCP), a chip on film (COF), or a flexible print circuit (FPC) and may be attached to the display panel 1500 by a tape automatic bonding (TAB) method, or may be mounted in a non-display region of the display panel 1500 by a chip on glass (COG) method.

The gate driver 1300 may include a plurality of GDICs, and a plurality of GDICs may be mounted in a circuit film and attached to the display panel 1500 by a TAB method, or may be mounted in a non-display region of the display panel 1500 by a COG method. Alternatively, the gate driver 1300 may be directly formed on a lower substrate of the display panel 1500 by a gate-driver in panel (GIP) method. The gate driver 1300 may be formed in a non-display region outside a pixel array where pixels are formed in the display panel 1500 and may be formed through the same TFT process as the pixels.

The read-out circuit 1400 may include a plurality of read-out ICs (RDICs), and the plurality of RDICs may be mounted on a circuit film, such as a TCP, a COF, or an FPC and attached to the display panel 1500 by a TAB method, or may be mounted in a non-display region of the display panel 1500 by a COG method. As described with reference to FIGS. 1 to 13, the read-out circuit 1400 may generate read-out data by reading out electrical characteristics of the pixels PX. Although FIG. 14 illustrates that the read-out circuit 1400 is implemented as a separate chip from the source driver 1200, example embodiments are not limited thereto. At least one of the plurality of SDICs may include the read-out circuit 114 described with reference to FIG. 1. The display panel 1500 may include the pixels PX described with reference to FIGS. 1 to 13.

Figure 15:
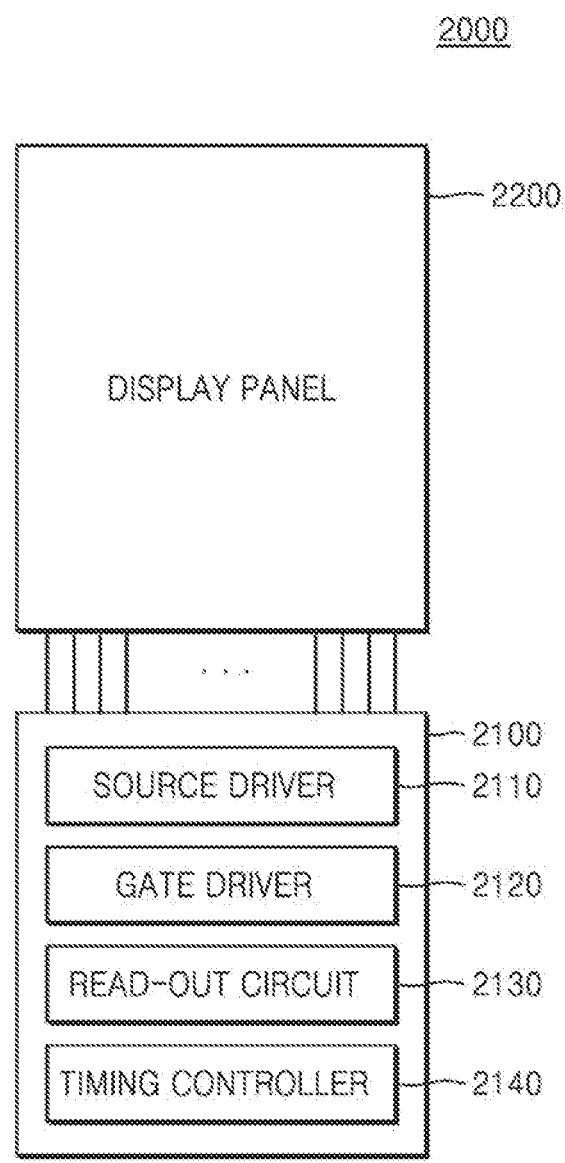
FIG. 15 illustrates a display device according to an example embodiment.

FIG. 15 illustrates a display device according to an example embodiment.

A display device 2000 of FIG. 15 may include a display panel 2200 with a small size and may be applied to mobile devices, such as smart phones or tablet PCs, or wearable devices. Referring to FIG. 15, the display device 2000 may include a display drive circuit 2100 and the display panel 2200. The display drive circuit 2100 may be composed of one or more ICs, mounted on a circuit film, such as a TCP, a COF, or an FPC, and attached to the display panel 2200 by a TAB method, or may be mounted in a non-display region (for example, a region where no image is displayed) of the display panel 2200 by a COG method.

The display drive circuit 2100 may include a source driver 2110, a gate driver 2120, a read-out circuit 2130 and a timing controller 2140. The source driver 2110 may be the same as or similar to the data driver 112 of FIG. 1, the gate driver 2120 may be the same as or similar to the scan driver 113 of FIG. 1, and the timing controller 2140 may be the same as or similar to the control logic circuit 111 of FIG. 1. As described with reference to FIGS. 1 to 14, the read-out circuit 2130 may generate read-out data by reading out electrical characteristics of the pixels PX.

The display panel 2200 may be the same as or similar to the display panel 120 of FIG. 1, and the display panel 2200 may include the pixels PX including the OLED OD described with reference to FIGS. 1 to 14.

Figure 16:
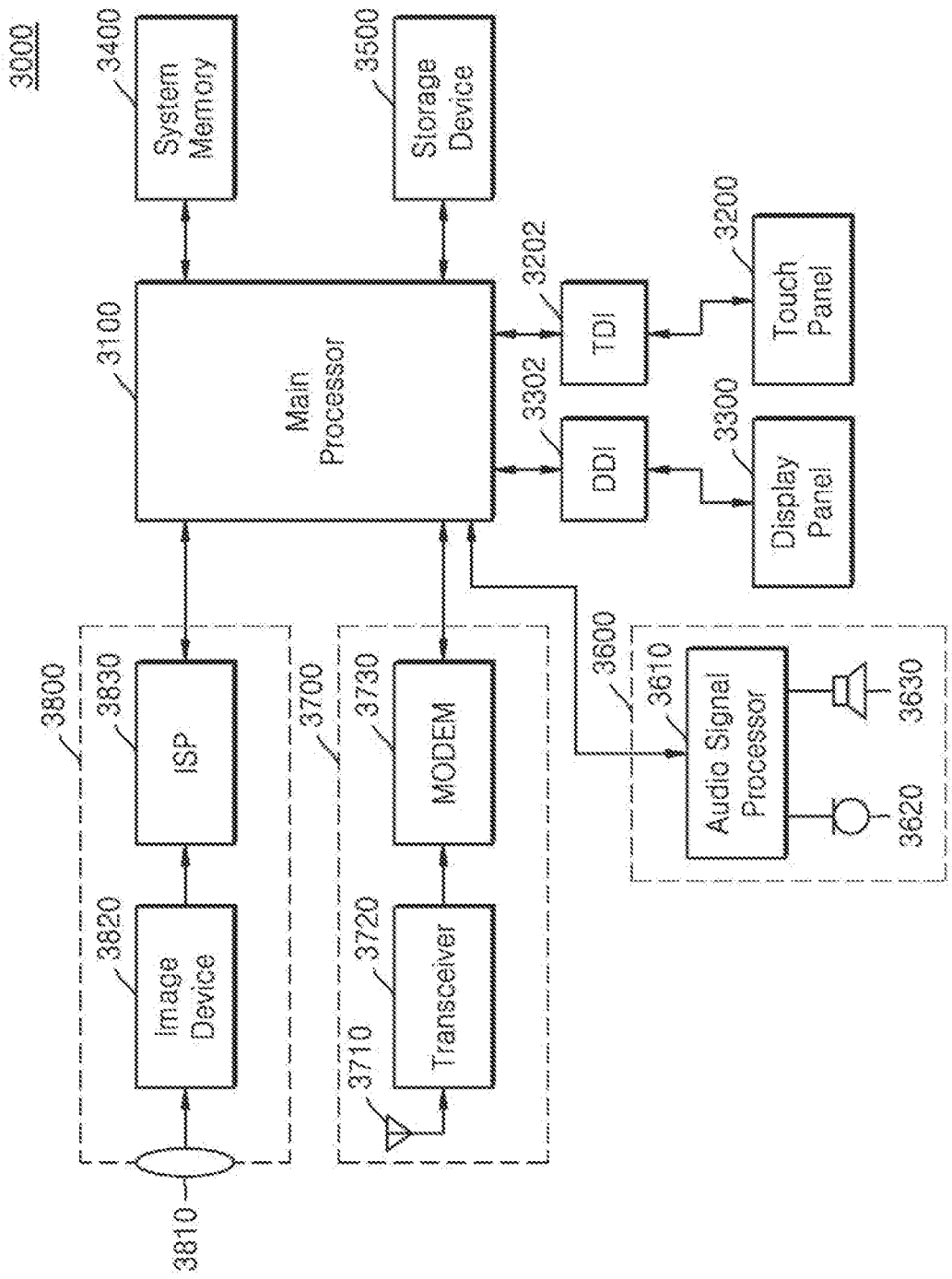
FIG. 16 is a block diagram illustrating an electronic device according to an example embodiment.

FIG. 16 is a block diagram illustrating an electronic device according to an example embodiment.

Referring to FIG. 16, an electronic device 3000 may include a main processor 3100, a touch panel 3200, a touch drive circuit 3202, a display panel 3300, a display drive circuit 3302, a system memory 3400, a storage device 3500, an audio processor 3600, a communication block 3700, an image processor 3800, and a power management circuit 3900. In one example embodiment, the electronic device 3000 may be one of various electronic devices, such as a mobile communication terminal, a personal digital assistant (PDA), a portable media player (PMP), a digital camera, a smartphone, a tablet computer, a laptop computer, and a wearable device, or may be one of various communication devices supporting wireless communication mediation, such as a wireless router and a wireless communication base station. In one example embodiment, the electronic device 3000 may further include components other than the components illustrated in FIG. 16, or some of the components illustrated in FIG. 15 may be omitted from the electronic device 3000.

The main processor 3100 may control all operations of the electronic device 3000. The main processor 3100 may control and manage operations of components of the electronic device 3000. The main processor 3100 may process various operations to operate the electronic device 3000.

The touch panel 3200 may be configured to detect a touch input from a user under control by the touch drive circuit 3202. The display panel 3300 may be configured to display image information under control by the display drive circuit 3302. In one example embodiment, the display panel 3300 and the display drive circuit 3302 may be respectively the display panel and the display drive circuit described with reference to FIGS. 1 to 14. The display panel 3300 and the display drive circuit 3302 may operate based on the operation method described with reference to FIGS. 1 to 14.

The system memory 3400 may store data used for the operation of the electronic device 3000. For example, the system memory 3400 may include volatile memory, such as static random access memory (SRAM), dynamic RAM (DRAM), or synchronous DRAM (SDRAM), and/or non-volatile memory, such as phase-change RAM (PRAM), magneto-resistive RAM (MRAM), resistive RAM (Re-RAM), or ferro-electric RAM (FRAM).

The storage device 3500 may store data regardless of a power supply. For example, the storage device 3500 may include at least one of various nonvolatile memories, such as flash memory, PRAM, MRAM, ReRAM, and FRAM. For example, the storage device 3500 may include a built-in memory and/or a removable memory of the electronic device 3000.

The audio processor 3600 may process an audio signal by using the audio signal processor 3610. The audio processor 3600 may receive an audio input through a microphone 3620 or provide an audio output through a speaker 3630.

The communication block 3700 may exchange signals with an external device and/or an external system through an antenna 3710. A transceiver 3720 and a modem (modulator/demodulator, 1730) of the communication block 3700 may process signals exchanged with an external device and/or an external system according to at least one of various wireless communication protocols, such as long term evolution (LTE), worldwide Interoperability for microwave access (WiMax), global system for mobile communication (GSM), code division multiple access (CDMA), Bluetooth, near field communication (NFC), wireless fidelity (Wi-Fi), and radio frequency identification (RFID).

The image processor 3800 may receive light through a lens 3810. An image device 3820 and an image signal processor 3830 included in the image processor 3800 may generate image information on an external object based on the received light.

While aspects of example embodiments have been particularly shown and described, it will be understood that various changes in form and details may be made therein without departing from the spirit and scope of the following claims.

What is claimed is:

1. A display device comprising:
a plurality of pixels arranged in rows and columns;
a scan driver connected to the rows of the plurality of pixels through a plurality of first conductive lines, a plurality of second conductive lines, a plurality of third conductive lines, a plurality of fourth conductive lines, and a plurality of fifth conductive lines;
a data driver connected to the columns of the plurality of pixels through a plurality of sixth conductive lines; and
a read-out circuit connected to the columns of the plurality of pixels through a plurality of seventh conductive lines and configured to obtain a plurality of read-out signals indicating electrical characteristics of the plurality of pixels through the plurality of seventh conductive lines,
wherein a first pixel of the plurality of pixels is connected to a first conductive line among the plurality of first conductive lines, a second conductive line among the plurality of second conductive lines, a third conductive line among the plurality of third conductive lines, a fourth conductive line among the plurality of fourth conductive lines, a fifth conductive line among the plurality of fifth conductive lines, a sixth conductive line among the plurality of sixth conductive lines and a seventh conductive line among the plurality of seventh conductive lines, and the first pixel comprises:
a first transistor comprising a first terminal connected to a first node, a second terminal connected to a third node, and a gate connected to a second node;
a second transistor comprising a first terminal connected to the sixth conductive line, a second terminal connected to the first node, and a gate connected to the first conductive line;
a third transistor comprising a first terminal connected to the second node, a second terminal connected to the third node, and a gate connected to the first conductive line;
a fourth transistor comprising a first terminal connected to a power supply node to which a power supply voltage is supplied, a second terminal connected to the first node, and a gate connected to the second conductive line;
a fifth transistor comprising a first terminal connected to the third node, a second terminal, and a gate connected to the third conductive line;
a sixth transistor comprising a first terminal connected to the seventh conductive line, a second terminal connected to the second node, and a gate connected to the fourth conductive line;
a seventh transistor comprising a first terminal connected to the seventh conductive line, a second terminal connected to the third node, and a gate connected to the fifth conductive line;
a capacitor connected between the first node and the second node; and
an organic light emitting diode connected between the second terminal of the fifth transistor and a ground node to which a ground voltage is supplied.

2. The display device of claim 1, wherein the scan driver is configured to, in a reset period, output a first control signal at an inactive level through the first conductive line, a second control signal at an active level through the second conductive line, a third control signal at an inactive level through the third conductive line, a fourth control signal at an active level through the fourth conductive line, and a fifth control signal at an inactive level through the fifth conductive line.

3. The display device of claim 1, wherein the scan driver is configured to, in a program period, output a first control signal at an active level through the first conductive line, output a second control signal at an inactive level through the second conductive line, output a third control signal at an inactive level through the third conductive line, output a fourth control signal at an inactive level through the fourth conductive line, and output a fifth control signal at an inactive level through the fifth conductive line.

4. The display device of claim 1, wherein the scan driver is configured to, in a hold period, output a first control signal at an inactive level through the first conductive line, a second control signal at an inactive level through the second conductive line, a third control signal at an inactive level through the third conductive line, a fourth control signal at an inactive level through the fourth conductive line, and a fifth control signal at an inactive level through the fifth conductive line.

5. The display device of claim 1, wherein the scan driver is configured to, in a light emission period, output a first control signal at an inactive level through the first conductive line, output a second control signal at an active level through the second conductive line, output a third control signal at an active level through the third conductive line, output a fourth control signal at an inactive level through the fourth conductive line, and output a fifth control signal at an inactive level through the fifth conductive line.

6. The display device of claim 1, wherein the scan driver is configured to, in a first read-out period, output a first control signal at an inactive level through the first conductive line, output a second control signal at an active level through the second conductive line, output a third control signal at an inactive level through the third conductive line, output a fourth control signal at an inactive level through the fourth conductive line, and output a fifth control signal at an active level through the fifth conductive line, and
wherein the read-out circuit is further configured to generate data corresponding to a drive current based on a corresponding read-out signal, among the plurality of read-out signals, received through the seventh conductive line.

7. The display device of claim 6, wherein the scan driver is further configured to, in a second read-out period, output the first control signal at an active level through the first conductive line, output the second control signal at an inactive level through the second conductive line, output the third control signal at an inactive level through the third conductive line, output the fourth control signal at an inactive level through the fourth conductive line, and output the fifth control signal at an active level through the fifth conductive line, and
wherein the read-out circuit is further configured to generate data corresponding to a threshold voltage based on the corresponding read-out signal received through the seventh conductive line.

8. The display device of claim 7, wherein the scan driver is further configured to, in a third read-out period, output the first control signal at an inactive level through the first conductive line, output the second control signal at an active level through the second conductive line, output the third control signal at an active level through the third conductive line, output the fourth control signal at an inactive level through the fourth conductive line, and output the fifth control signal at an active level through the fifth conductive line, and
wherein the read-out circuit is further configured to generate data corresponding to a forward voltage based on the corresponding read-out signal received through the seventh conductive line.

9. The display device of claim 1, wherein the data driver is configured to control brightness of the organic light emitting diode by controlling a voltage of the sixth conductive line.

10. The display device of claim 1, wherein the scan driver is configured, in a light emission period, output a first control signal at an inactive level through the first conductive line, output a second control signal at an active level through the second conductive line, output a fourth control signal at an inactive level through the fourth conductive line, output a fifth control signal at an inactive level through the fifth conductive line, output a third control signal at an active level through the third conductive line in a first portion of the light emission period, and output the third control signal at an inactive level through the third conductive line in a second portion of the light emission period.

11. The display device of claim 10, wherein the scan driver is further configured to control a time of the first portion based on a luminance.

12. The display device of claim 11, wherein the data driver is configured to control brightness of the organic light emitting diode by controlling a voltage of the sixth conductive line and the time of the first portion.

13. The display device of claim 1, wherein a size of the second transistor is less than a size of the third transistor.

14. The display device of claim 1, wherein a voltage of an initialization power supply is applied to each of the plurality of pixels through the plurality of seventh conductive lines in a reset period, and
wherein each of the plurality of pixels is configured to output a read-out signal through the plurality of seventh conductive lines in a first read-out period, a second read-out period and a third read-out period.

15. The display device of claim 1, further comprising a selection circuit comprising:
a first switch connected between the seventh conductive line and an initialization power supply node to which an initialization voltage is supplied; and
a second switch connected between the seventh conductive line and the read-out circuit,
wherein the selection circuit is configured to:
turn on the first switch and turn off the second switch in a reset period; and
turn off the first switch and turn on the second switch in a read-out period.

16. A display panel comprising:
a plurality of pixels,
wherein a first pixel of the plurality of pixels comprises:
a scan line extending in a first direction;
a first light emission control line extending in the first direction;
a second light emission control line extending in the first direction;
an initialization line extending in the first direction;
a read-out control line extending in the first direction;
a data line extending in a second direction crossing the first direction;
a read-out line extending in the second direction;
a first transistor connected between a first node and a third node, and configured to operate according to a voltage of a second node;

a second transistor connected between the first node and the data line, and configured to operate according to a scan signal received through the scan line;

a third transistor connected between the second node and the third node, and configured to operate according to the scan signal;

a fourth transistor connected between a first drive power node and the first node, and configured to operate according to a first light emission control signal received through the first light emission control line;

a fifth transistor connected between the third node and an organic light emitting diode, and configured to operate according to a second light emission control signal received through the second light emission control line;

a sixth transistor connected between the read-out line and the second node, and configured to operate according to an initialization signal received through the initialization line;

a seventh transistor connected between the read-out line and the third node, and configured to operate according to a read-out control signal received through the read-out control line;

a capacitor connected between the first node and the second node; and the organic light emitting diode connected between the fifth transistor and a second drive power node.

17. The display panel of claim 16, wherein the first pixel is configured to, in a reset period, receive the scan signal at an inactive level through the scan line, receive the first light emission control signal at an active level through the first light emission control line, receive the second light emission control signal at an inactive level through the second light emission control line, receive the initialization signal at an active level through the initialization line, and receive the read-out control signal at an inactive level through the read-out control line, wherein the first pixel is further configured to, in a program period, receive the scan signal at an active level through the scan line, receive the first light emission control signal at an inactive level through the first light emission control line, receive the second light emission control signal at an inactive level through the second light emission control line, receive the initialization signal at an inactive level through the initialization line, and receive the read-out control signal at an inactive level through the read-out control line, wherein the first pixel is further configured to, in a hold period, receive the scan signal at an inactive level through the scan line, receive the first light emission control signal at an inactive level through the first light emission control line, receive the second light emission control signal at an inactive level through the second light emission control line, receive the initialization signal of an inactive level through the initialization line, and receive the read-out control signal at an inactive level through the read-out control line, and wherein the first pixel is further configured to, in a light emission period, receive the scan signal at an inactive level through the scan line, receive the first light emission control signal at an active level through the first light emission control line, receive the second light emission control signal at an active level through the second light emission control line, receive the initialization signal at an inactive level through the initialization line, and receive the read-out control signal at an inactive level through the read-out control line.

18. The display panel of claim 16, wherein the first pixel is configured to, in a first read-out period, receive the scan signal at an inactive level through the scan line, receive the first light emission control signal at an active level through the first light emission control line, receive the second light emission control signal at an inactive level through the second light emission control line, receive the initialization signal at an inactive level through the initialization line, receive the read-out control signal at an active level through the read-out control line, and output a drive current through the read-out line, wherein the first pixel is further configured to, in a second read-out period, receive the scan signal at an active level through the scan line, receive the first light emission control signal at an inactive level through the first light emission control line, receive the second light emission control signal at an inactive level through the second light emission control line, receive the initialization signal at an inactive level through the initialization line, receive the read-out control signal at an active level through the read-out control line, and output a voltage obtained by subtracting a threshold voltage from a data voltage through the read-out line, and wherein the first pixel is further configured to, in a third read-out period, receive the scan signal at an inactive level through the scan line, receive the first light emission control signal at an active level through the first light emission control line, receive the second light emission control signal at an active level through the second light emission control line, receive the initialization signal at an inactive level through the initialization line, receive the read-out control signal at an active level through the read-out control line, and output a forward voltage through the read-out line.

19. A display device comprising:
a display panel comprising a plurality of pixels; and
a display drive circuit comprising a scan driver, a data driver, and a read-out circuit,
wherein a first pixel of the plurality of pixels comprises:
an organic light emitting diode;
a first transistor connected between a first node and a third node, and configured to operate according to a voltage of a second node;
a second transistor connected between the first node and a data line, and configured to operate according to a scan signal received through a scan line;
a third transistor connected between the second node and the third node, and configured to operate according to the scan signal;
a fourth transistor connected between a first drive power supply and the first node, and configured to operate according to a first light emission control signal received through a first light emission control line;
a fifth transistor connected between the third node and the organic light emitting diode, and configured to operate according to a second light emission control signal received through a second light emission control line;
a sixth transistor connected between a read-out line and the second node, and configured to operate according to an initialization signal received through an initialization line;
a seventh transistor connected between the read-out line and the third node, and configured to operate according to a read-out control signal received through a read-out control line; and a capacitor connected between the first node and the second node;

wherein the organic light emitting diode is connected between the fifth transistor and a second drive power supply, wherein the scan driver is connected to the plurality of pixels through the scan line, the first light emission control line, the second light emission control line, the initialization line, and the read-out control line, wherein the data driver is connected to the plurality of pixels through the data line and is configured to supply a data voltage corresponding to luminance through the data line, and wherein the read-out circuit is connected to the plurality of pixels through the read-out line, and is configured to read out electrical characteristics of the plurality of pixels through the read-out line.

20. The display device of claim 19, wherein the scan driver is configured to independently control the first light emission control signal and the second light emission control signal, wherein the first pixel is configured to receive a voltage from an initialization power supply through the read-out line in a reset period, and output a read-out signal to the read-out circuit through the read-out line in a read-out period, and wherein the read-out circuit is configured to generate read-out data corresponding to one of a drive current, a threshold voltage, and a forward voltage based on the read-out signal received in the read-out period.

* * * * *